(12) United States Patent
Lee et al.

(10) Patent No.: US 11,456,381 B2
(45) Date of Patent: Sep. 27, 2022

(54) DRAIN-EXTENDED TRANSISTOR

(71) Applicant: TEXAS INSTRUMENTS INCORPORATED, Dallas, TX (US)

(72) Inventors: Meng-Chia Lee, Richardson, TX (US); Sunglyong Kim, Allen, TX (US); Seetharaman Sridhar, Richardson, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/123,835

(22) Filed: Dec. 16, 2020

(65) Prior Publication Data

US 2022/0190158 A1 Jun. 16, 2022

(51) Int. Cl.
*H01L 29/78* (2006.01)
*H01L 29/66* (2006.01)
*H01L 29/10* (2006.01)

(52) U.S. Cl.
CPC ...... *H01L 29/7838* (2013.01); *H01L 29/1045* (2013.01); *H01L 29/66628* (2013.01); *H01L 29/7817* (2013.01)

(58) Field of Classification Search
None
See application file for complete search history.

(56) References Cited

U.S. PATENT DOCUMENTS

| | | | |
|---|---|---|---|
| 7,687,853 B2 | 3/2010 | Pendharkar et al. | |
| 8,304,303 B2 | 11/2012 | Pendharkar | |
| 9,887,288 B2 | 2/2018 | Edwards et al. | |
| 10,651,274 B2 | 5/2020 | Kim et al. | |
| 2018/0197986 A1 | 7/2018 | Tsai et al. | |
| 2019/0123555 A1 | 4/2019 | Kim et al. | |
| 2019/0206997 A1* | 7/2019 | Kim | H01L 29/7835 |

OTHER PUBLICATIONS

Olsson, "1 W/mm RF Power Density at 3.2 GHz for a Dual-Layer RESURF LDMOS Transistor," IEEE Electron Device Letters, vol. 23, No. 4 (Apr. 2002), DOI: 10.1109/55.992840 IEEE, 3 Park Avenue, 17th Floor, New York, NY 10016-5997 USA.

Yamazaki, "High-Voltage p-Channel Level Shifter Using Charge-Controlled Self-Isolation Structure," Japanese Journal of Applied Physics, vol. 45, No. 9A (2006), pp. 6914-6916 IOP Publishing, Temple Circus Temple Way, Bristol BS1 6HG UK.

* cited by examiner

*Primary Examiner* — Xiaoming Liu
(74) *Attorney, Agent, or Firm* — Andrew R. Ralston; Charles A. Brill; Frank D. Cimino

(57) ABSTRACT

Described examples include an integrated circuit having a semiconductor substrate. The integrated circuit has a transistor that includes a buried layer having within the substrate, the buried layer defining a drift region between the buried layer and the top surface and a body region in the substrate extending from the buried layer to the surface of the substrate. The transistor also having a source formed in the body region, a drain extending from the buried layer to the surface of the substrate, a drift well extending from the buried layer toward the top surface and extending from the body region to the drain, a drift surface layer located between the drift well and the top, and a gate proximate to the surface of the substrate at the body region.

20 Claims, 23 Drawing Sheets

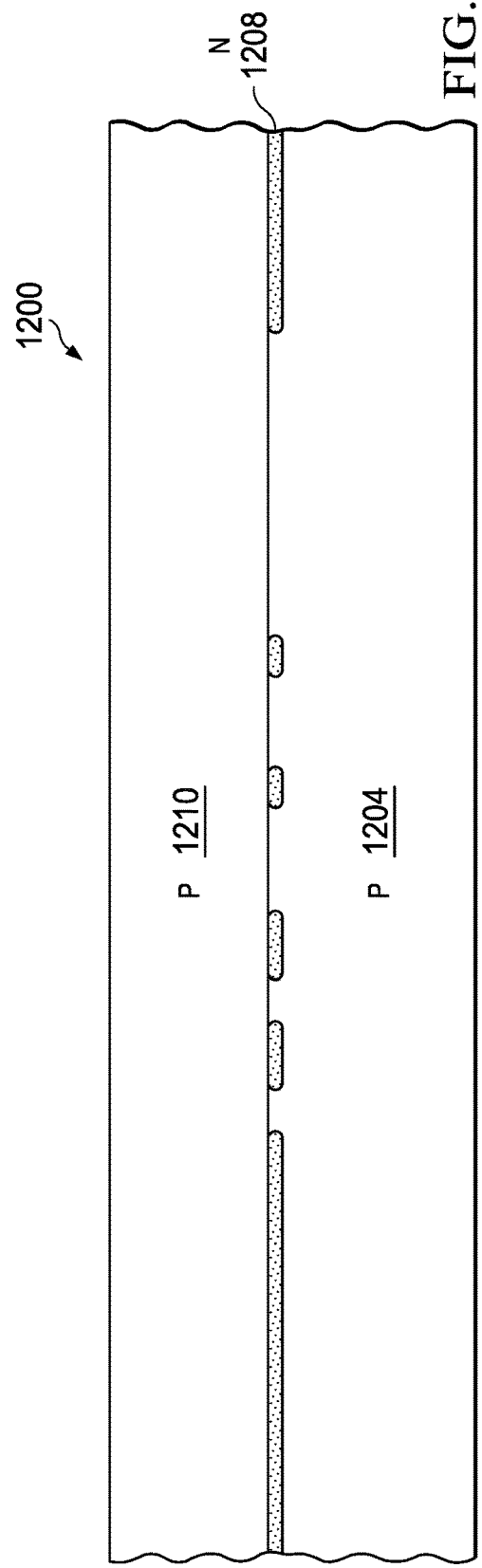
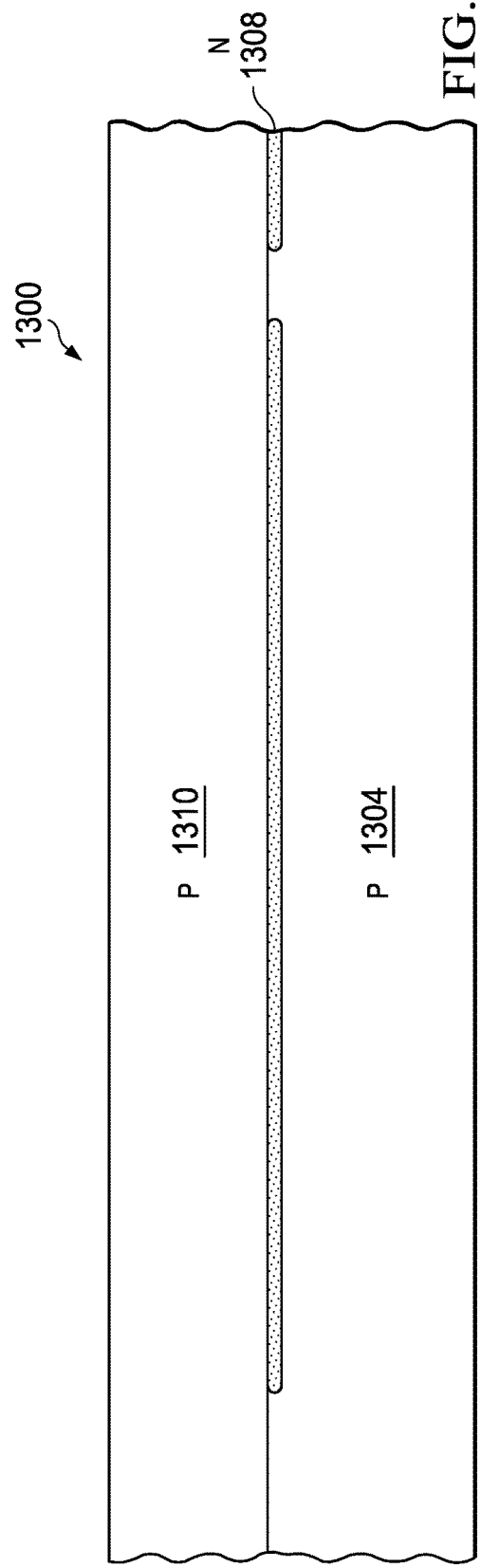

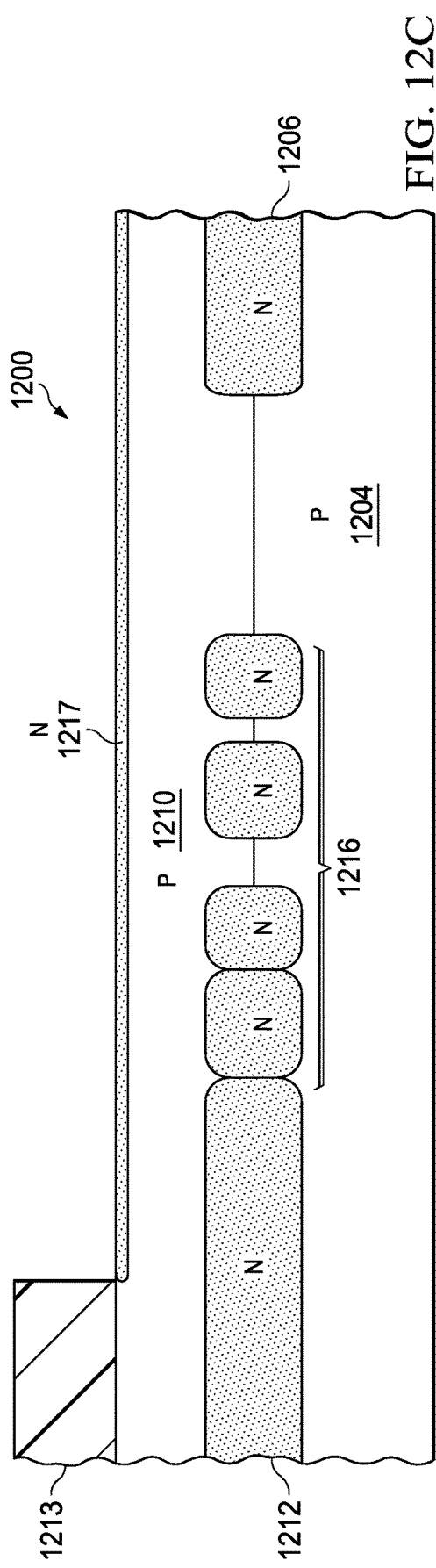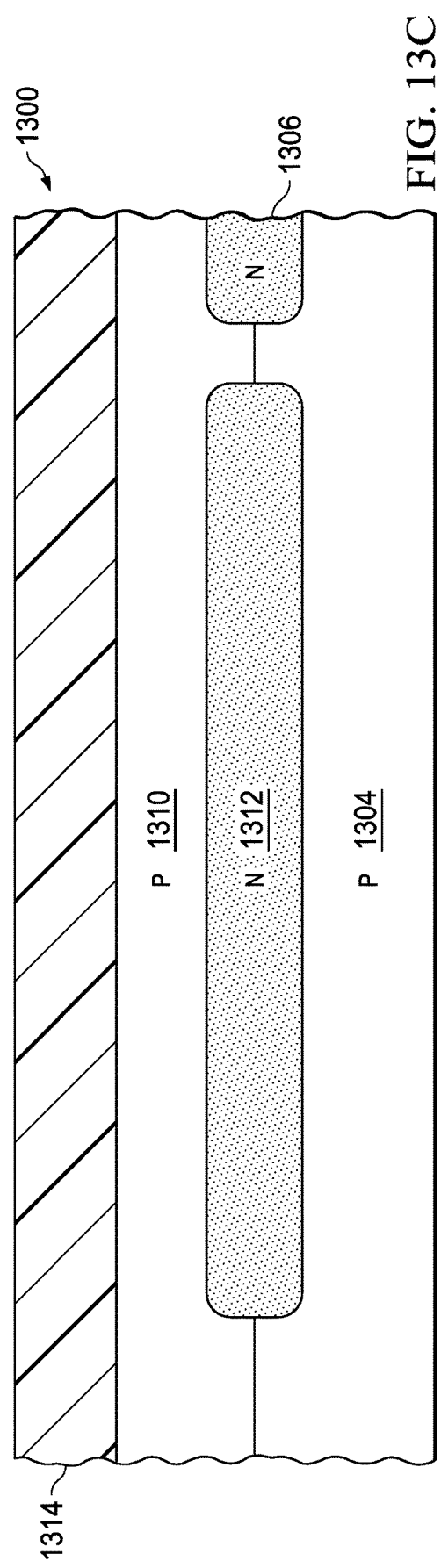

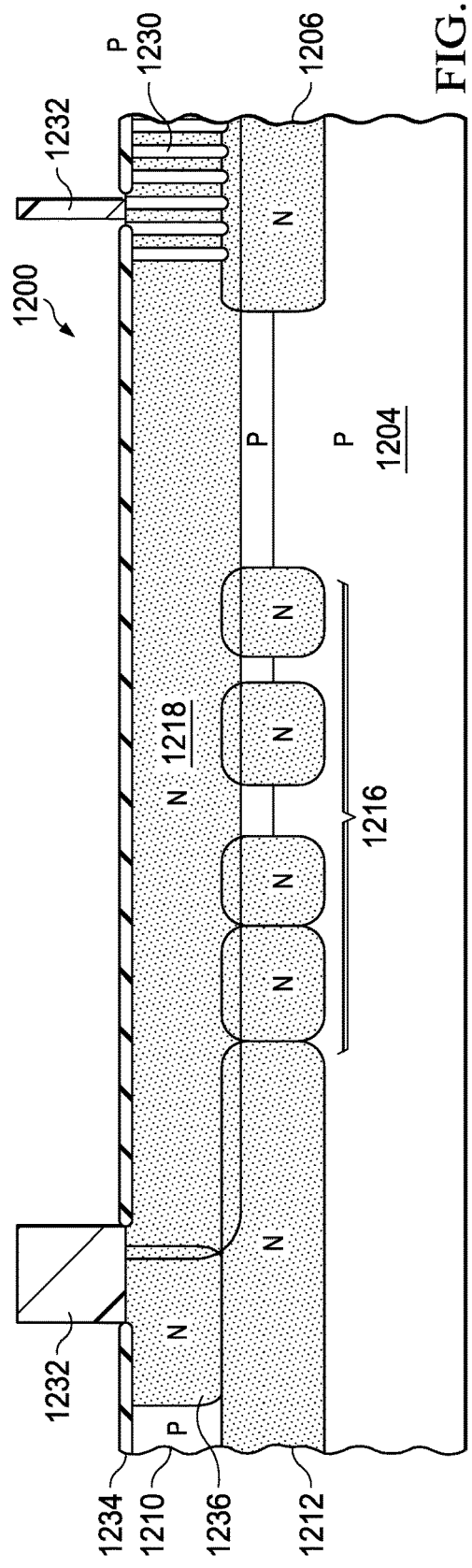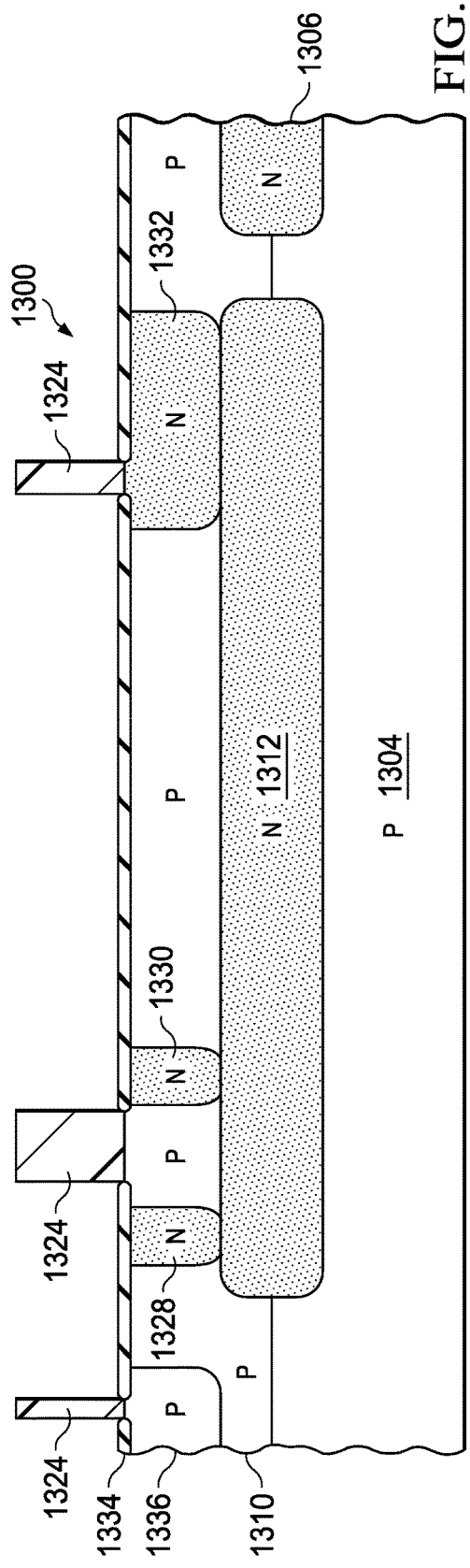

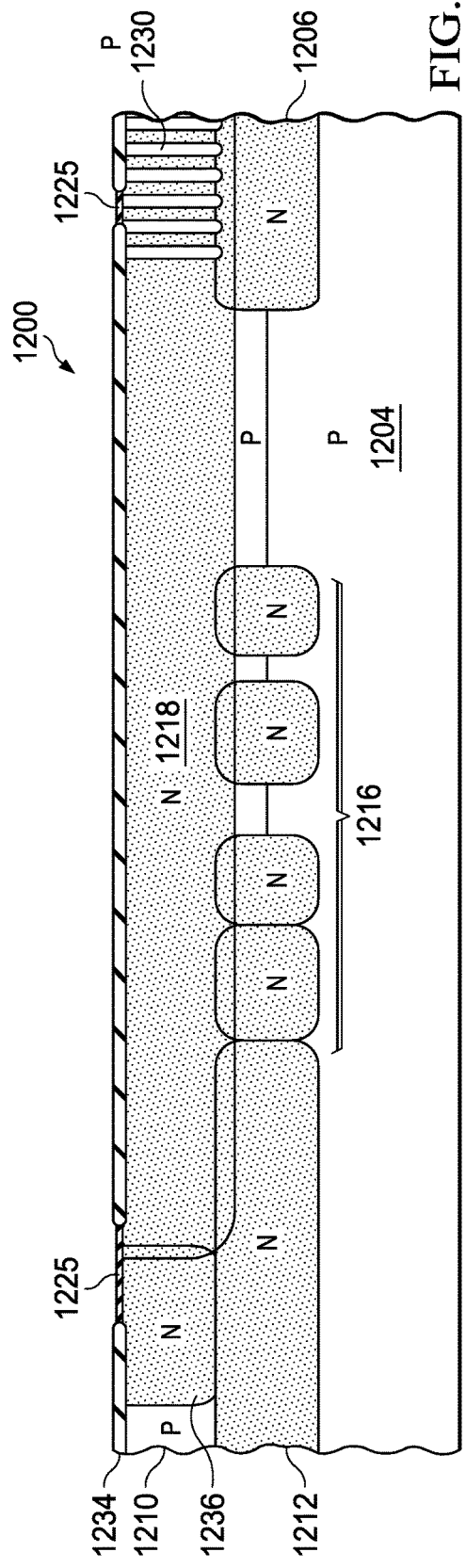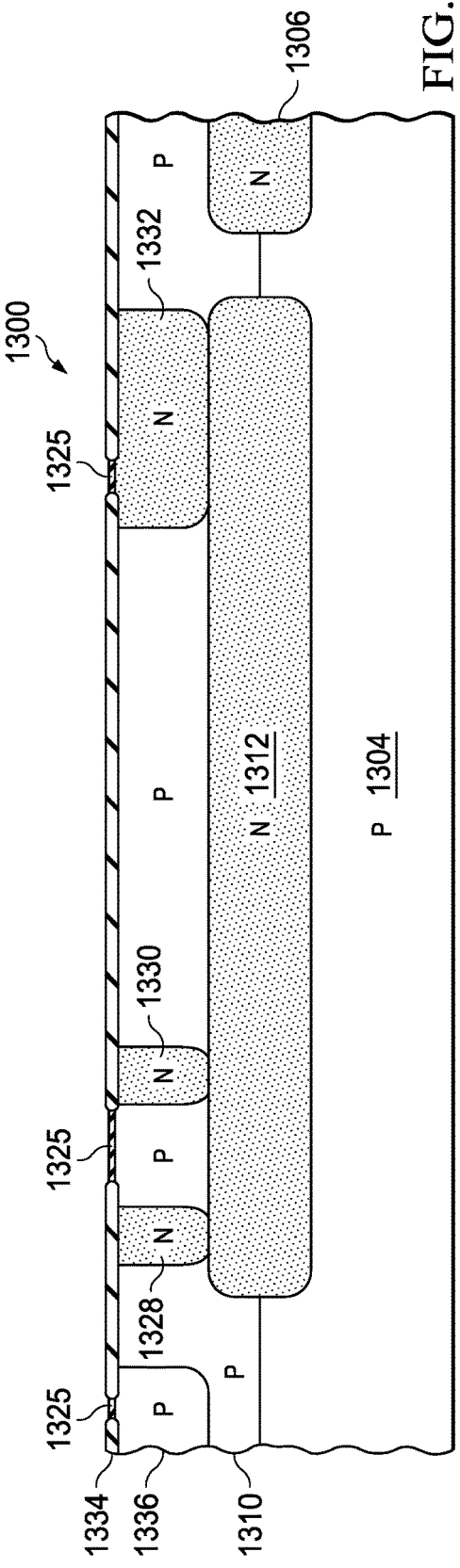

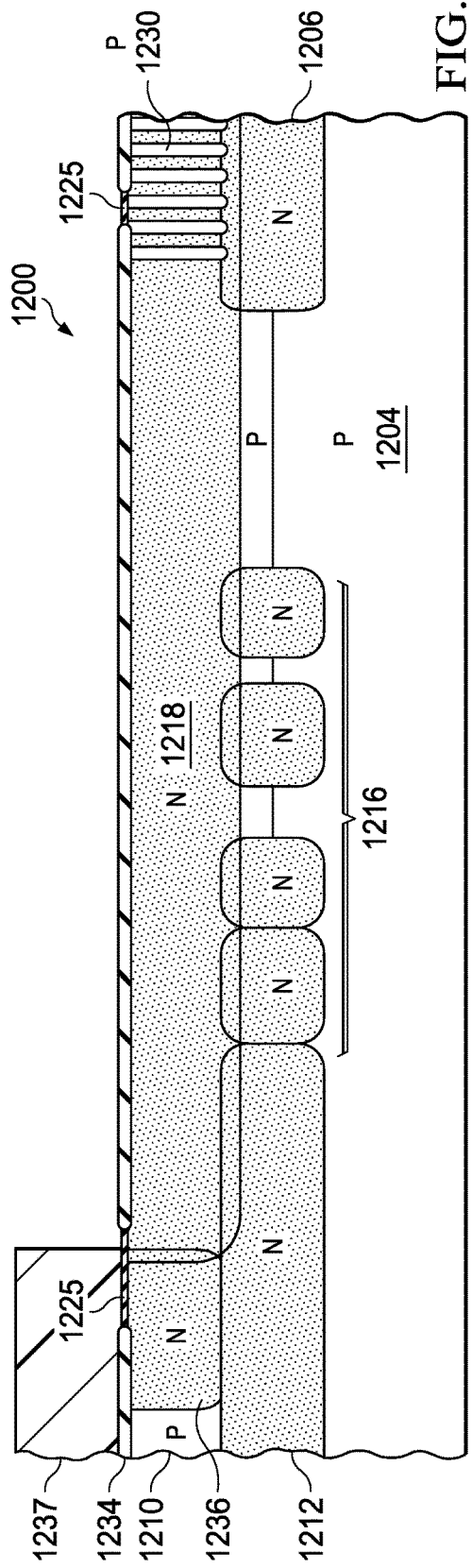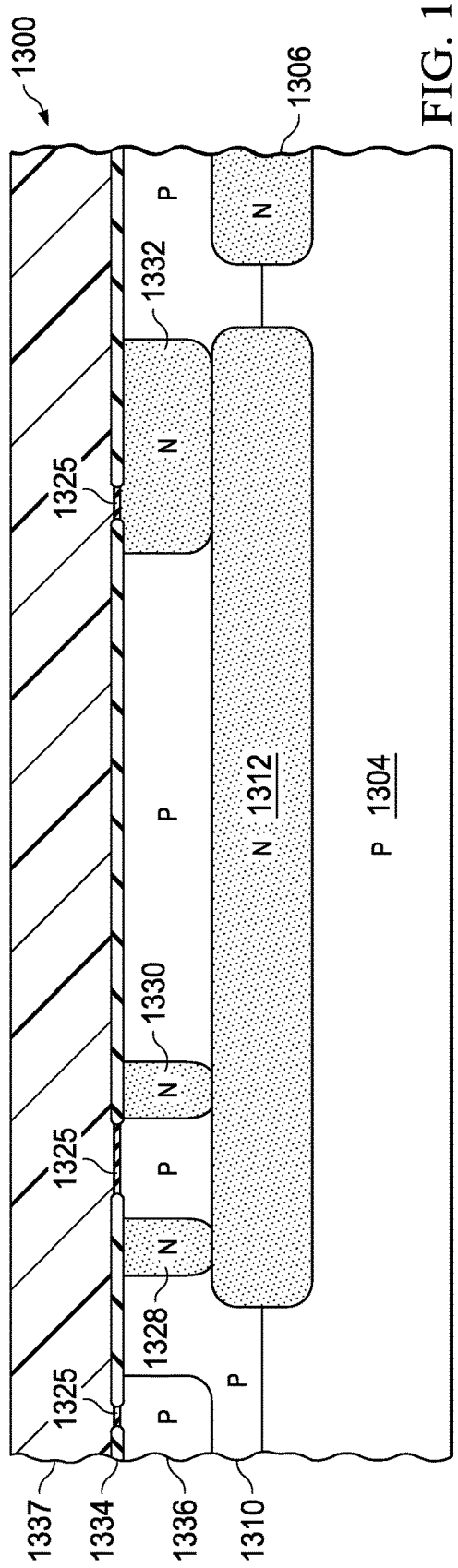

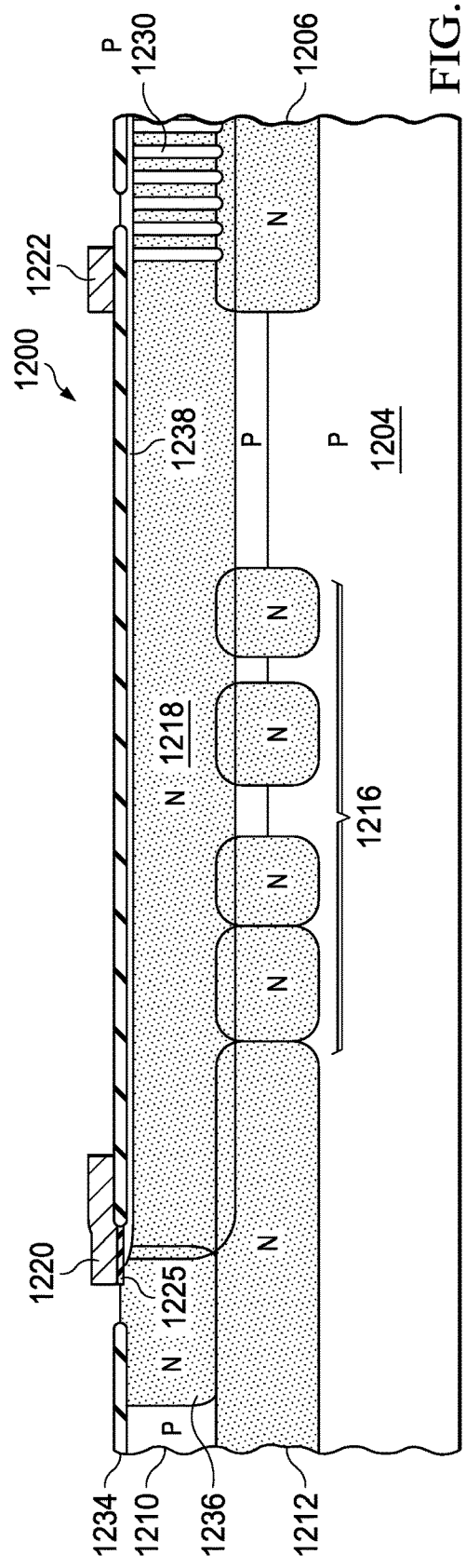
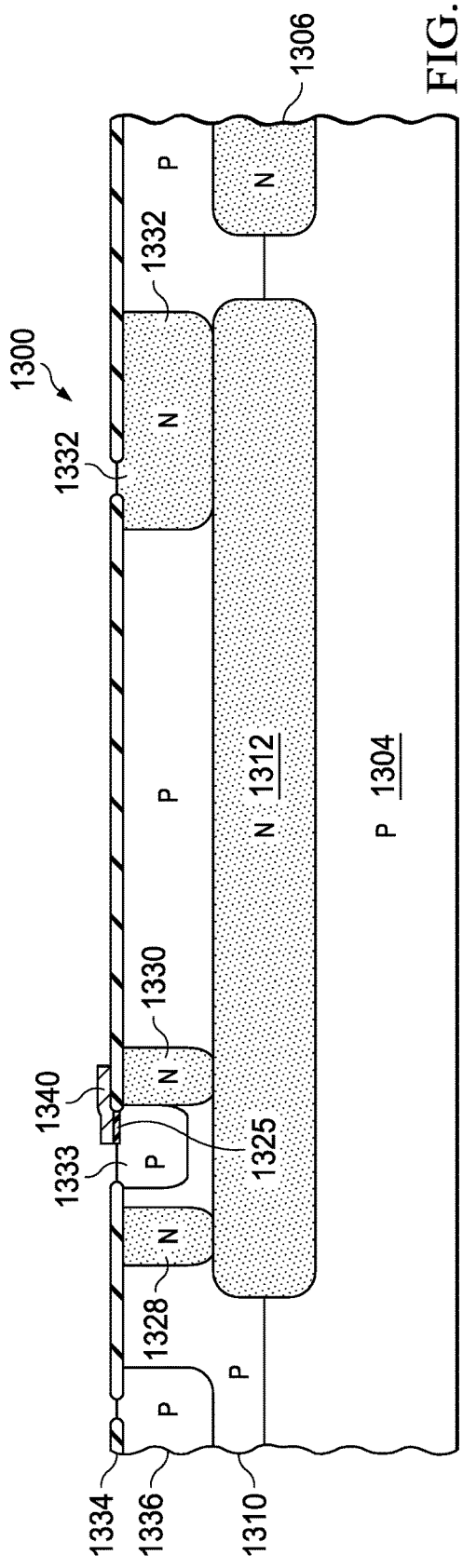

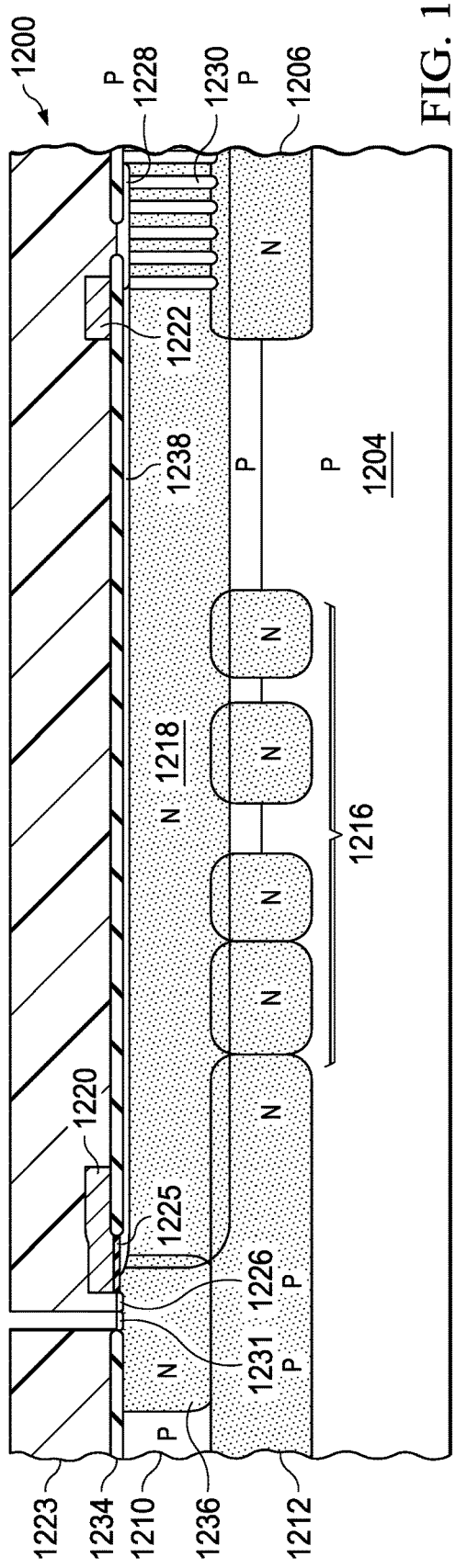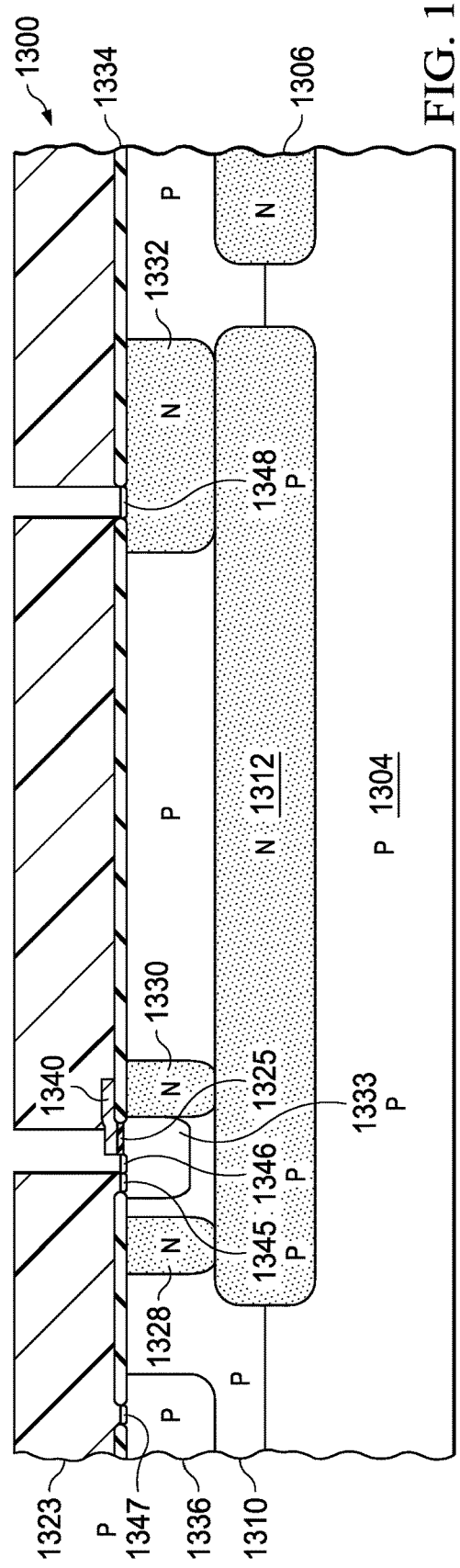
FIG. 12L
FIG. 13L

DRAIN-EXTENDED TRANSISTOR

TECHNICAL FIELD

This relates generally to high voltage transistors, and, in particular examples, but not exclusively, to drain-extended transistors.

BACKGROUND

Transistors used in high voltage/high power applications need special configurations. One such configuration is the drain-extended field effect transistor. In some examples, drain-extended transistors are metal-oxide-semiconductor (MOS) transistors. In example drain-extended MOS transistors, a depletion layer of a body region acts as a channel that allows conduction between the body region and a source and a drain. A gate modulates the depletion layer to modulate the conductivity of the transistor. An extended drain is a relatively long region between the drain contact and the channel. This area is sometimes called a drift region and is often defined by a buried layer. This long drift region distributes an applied voltage between the source and drain to avoid localized high electric fields, which can cause breakdown or other damage to the device.

One failure mechanism in high voltage transistors is hot electron injection. With some P-channel transistors, the primary carriers are holes (i.e. a place on the semiconductor crystal lattice that is missing an electron). Under high voltages, hot electrons can be injected into the oxide insulator on the surface of the drift region. These hot electrons induce holes nearby in the drift region. If enough hot electrons embed in the oxide insulator, the characteristics of the transistor can change. If the changes in characteristics are too great, the compromised transistor cannot perform its function in the circuit in which it is utilized, and the device that includes such a compromised transistor will fail to operate properly.

SUMMARY

In accordance with an example, an integrated circuit includes a semiconductor substrate having a first conductivity type and a top surface. The integrated circuit has a transistor that includes a buried layer having a second conductivity type within the substrate, the buried layer defining a drift region between the buried layer and the top surface and a body region in the substrate extending from the buried layer to the surface of the substrate and having the second conductivity type. The transistor also has a source having the first conductivity type formed in the body region, a drain having the first conductivity type and extending from the buried layer to the surface of the substrate, a drift well having the second conductivity type, the drift well extending from the buried layer toward the top surface and extending from the body region to the drain, a drift surface layer having the first conductivity type and located between the drift well and the top, and a gate proximate to the surface of the substrate at the body region.

BRIEF DESCRIPTION OF THE DRAWINGS

FIGS. 12A-M (collectively "FIG. 12") are cross section diagrams that illustrate the steps of FIG. 11 for forming an example DEPMOS transistor.

FIGS. 13A-M (collectively "FIG. 13") are cross section diagrams that illustrate the steps of FIG. 11 for forming an example LDMOS transistor.

DETAILED DESCRIPTION

Figure 1:
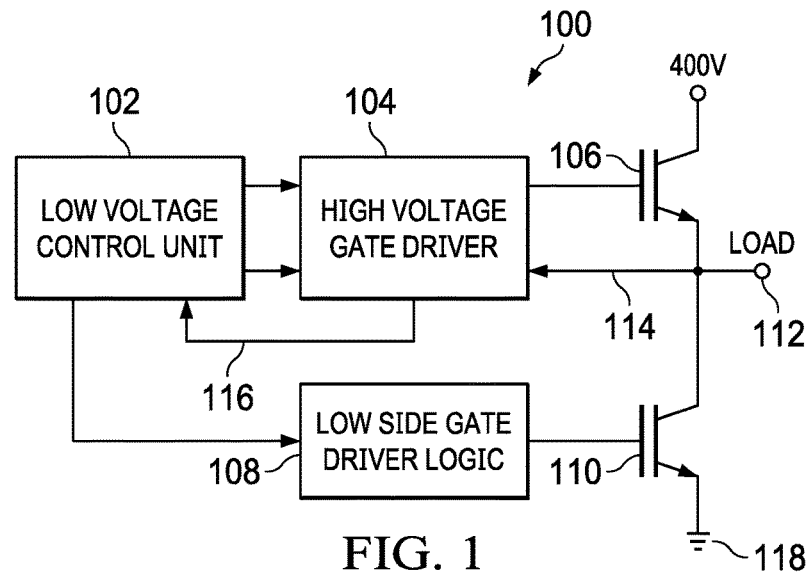
FIG. 1 is a schematic diagram of an example high-voltage drive circuit.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, in this description, the terms "on" and "over" may include layers or other elements where intervening or additional elements are between an element and the element that it is "on" or "over." The term "directly on" with respect a first layer over a second layer means the first layer touches the second layer.

Without implied limitation, in example arrangements, the problem of embedded hot electrons in a drain-extended transistor may be solved by including a highly doped drift surface layer in the drift region from the gate to the drain contact(s). The drift surface layer may stabilize or improve one or more characteristics of the transistor, such as the linear region current ($I_{dlin}$). Thus, transistors formed according to the discourse may operate acceptably even when that transistor has been compromised by hot electron injection into the oxide above the drift region. In accordance with an example, an integrated circuit includes a substrate having a first conductivity type and a transistor. The transistor includes a buried layer separated from a surface of the substrate having a second conductivity type in the substrate, the buried layer defining a drift region between the buried layer and the surface of the substrate, and having a body region in the substrate extending to the surface of the substrate and having the second conductivity type. The transistor also includes a source having the first conductivity type formed in the body region and a drain extending to the surface of the substrate having the first conductivity type. The transistor also includes a drift well formed within the drift region that extends from the body region to the drain and has the second conductivity type. A drift surface layer at the surface of the substrate in the drift well has the first conductivity type. The transistor also includes a gate proximate to the surface of the substrate at the body region and adjacent the source.

FIG. 1 is a schematic diagram of an example high-voltage drive circuit 100. High-voltage drive circuit 100 includes low voltage control unit 102. Low voltage control unit 102 operates at a relatively low voltage, such as 3.3 V or 5 V. Low voltage control unit 102 performs control functions such as communication, computation, and decision algorithms to determine when a high voltage signal is applied. Low voltage is used to operate low voltage control unit 102 because lower voltage semiconductor devices can have higher density, can be faster, and can be more energy efficient than high voltage semiconductor devices.

Low voltage control unit 102 provides control signals to high voltage gate driver logic 104. High voltage gate driver logic 104 receives the low voltage signals from low voltage control unit 102 and provides the high voltage signals needed to drive high side power transistor 106. In this example, high side power transistor 106 is an insulated gate, bipolar transistor (IGBT). Also, in this example, the drain (collector) of high side power transistor 106 is coupled to 400 V. In other examples, the voltage supply applied to high side power transistor may be 600 V or more. To drive high side power transistor 106, high voltage gate driver logic 104 must apply at least equal to the high voltage supply, e.g. 400 V, to the gate of high side power transistor 106. In many examples, high voltage gate driver logic 104 applies 400 V plus the threshold voltage of high side power transistor 106 to the gate of high side power transistor 106. When high side power transistor 106 is on, 400 V is applied to load 112 via the source (emitter) of high side power transistor 106. Examples of load 112 include motors, servos, and RF transmitters. Lead 114 provides a feedback signal to high voltage gate driver logic 104, which in turn provides a feedback signal to low voltage control unit 102 via lead 116.

Low side gate driver logic 108 drives low side power transistor 110. In this example, low side power transistor 110 is an IGBT. Low side gate driver logic 108 controls low side power transistor 110. Although low side gate driver logic 108 only needs to apply a few volts above ground 118 to turn on low side power transistor 110, low side power transistor 110 may be subjected to 400 V or more by transient voltages from the load. These transients may be transmitted to low side gate driver logic 108. Therefore, like high voltage gate driver logic 104, low side gate driver logic 108 is separated from low voltage control unit 102 to protect the relatively less robust devices in low voltage control unit 102. In this example, low voltage control unit 102, high voltage control unit and low side gate driver logic 108 are in a monolithic integrated circuit. In this example, transistor 106 and transistor 110 are in separate semiconductor dies and are packaged separately from low voltage control unit 102, high voltage gate driver logic 104 and low side gate driver logic 108. In other examples transistor 106 and transistor 110 are in separate semiconductor dies but are packaged in a hybrid package along with a die containing low voltage control unit 102, high voltage gate driver logic 104 and low side gate driver logic 108. In other examples, low voltage control unit 102, high voltage gate driver logic 104, low side gate driver logic 108, high side power transistor 106, and low side power transistor 110 are on the same die.

Figure 2:
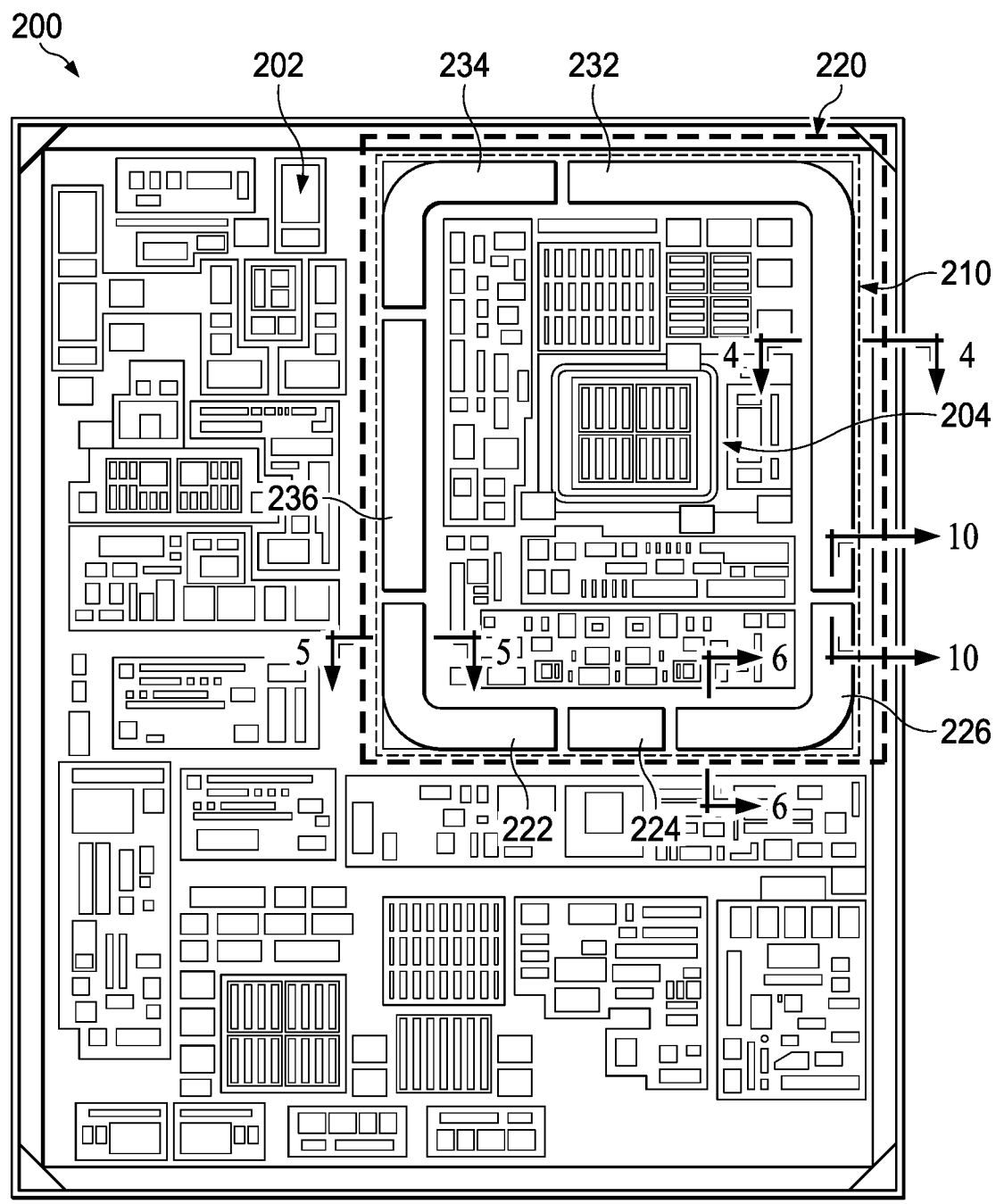
FIG. 2 is a plan view of an example driver circuit.
Figure 4:
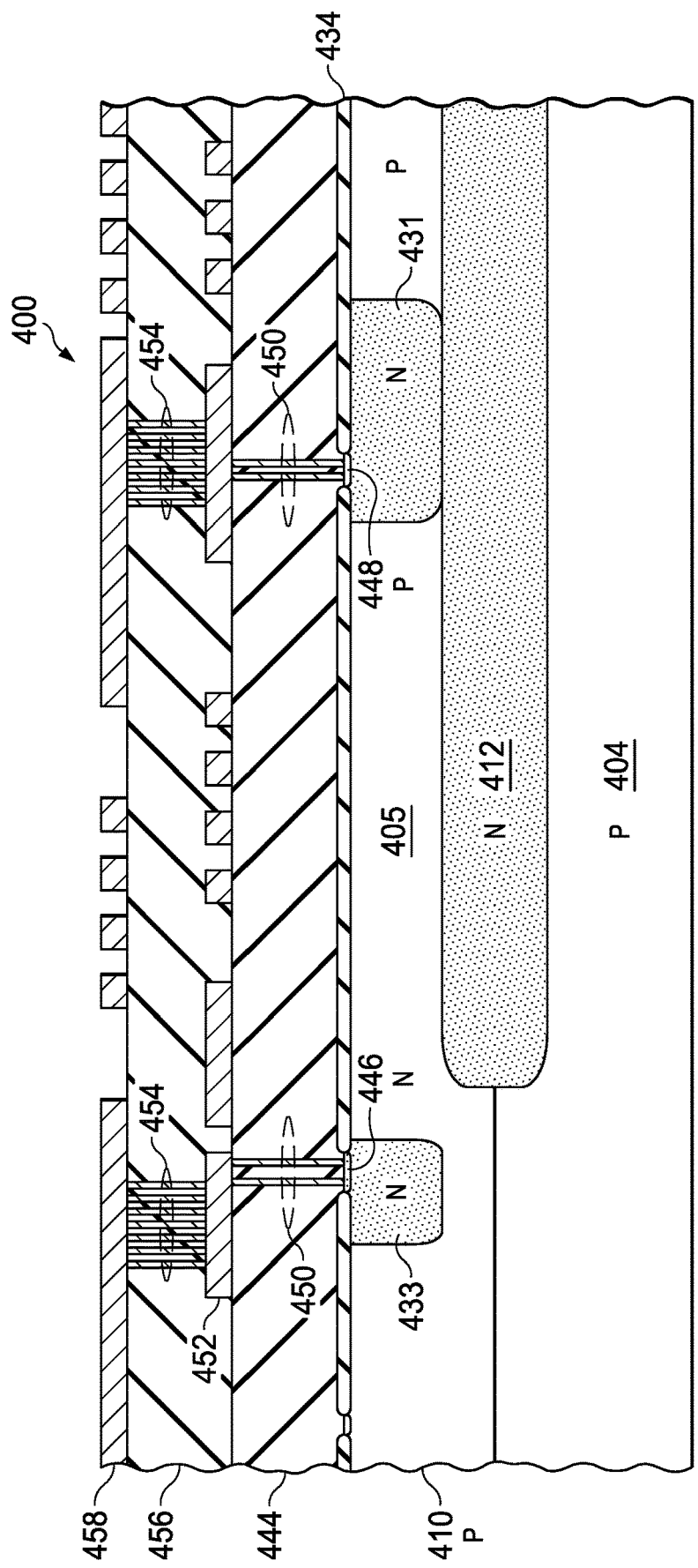
FIG. 4 is a cross section diagram of an example diode.
Figure 5:
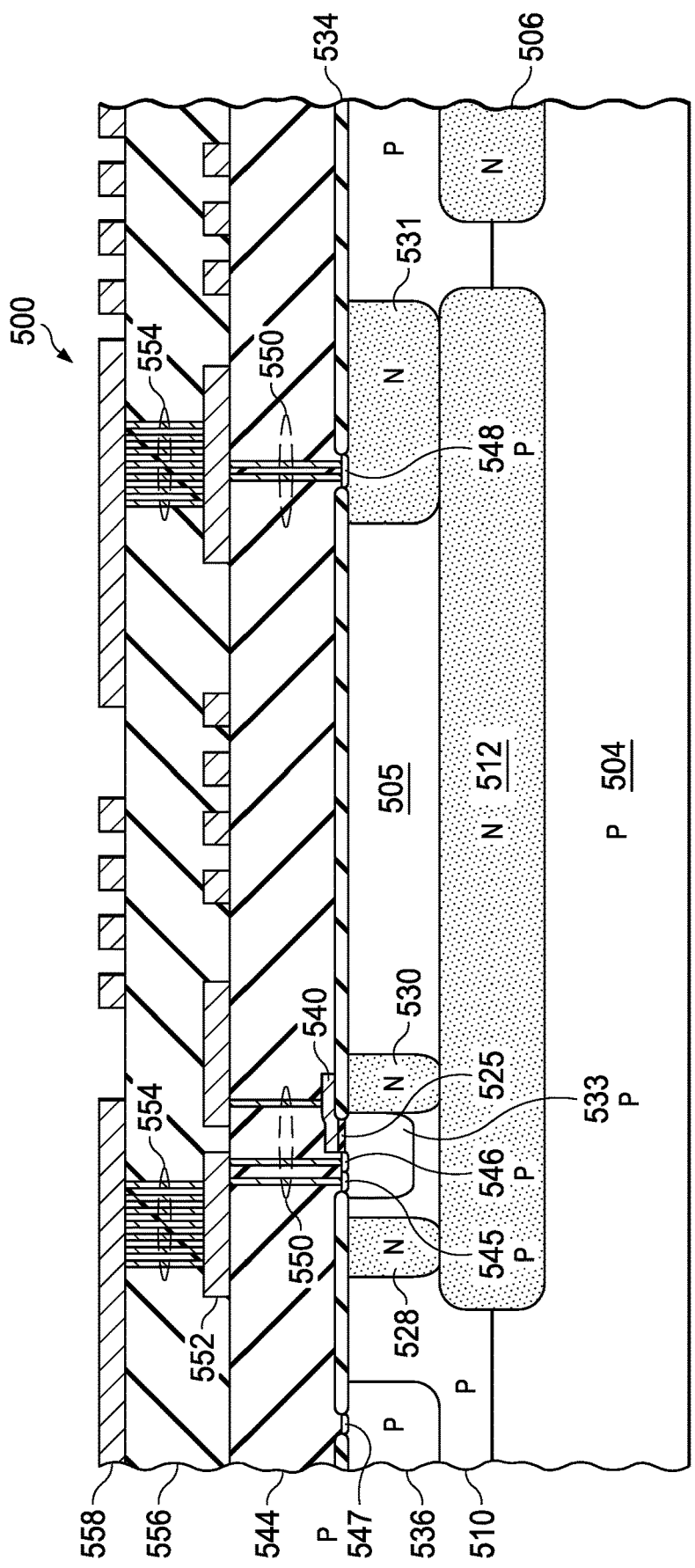
FIG. 5 is a cross section diagram of an example LDMOS transistor.
Figure 6:
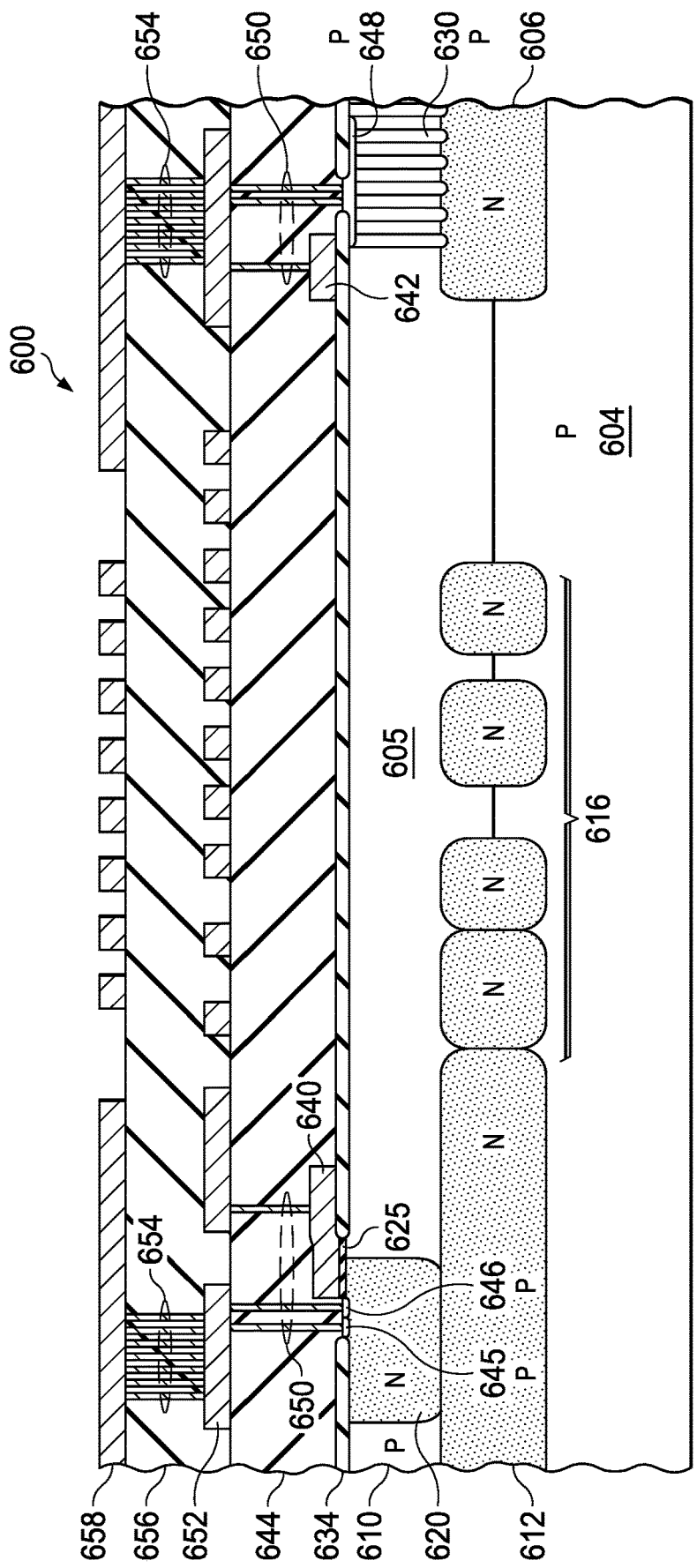
FIG. 6 is a cross section diagram of an example baseline DEPMOS transistor.
Figure 10:
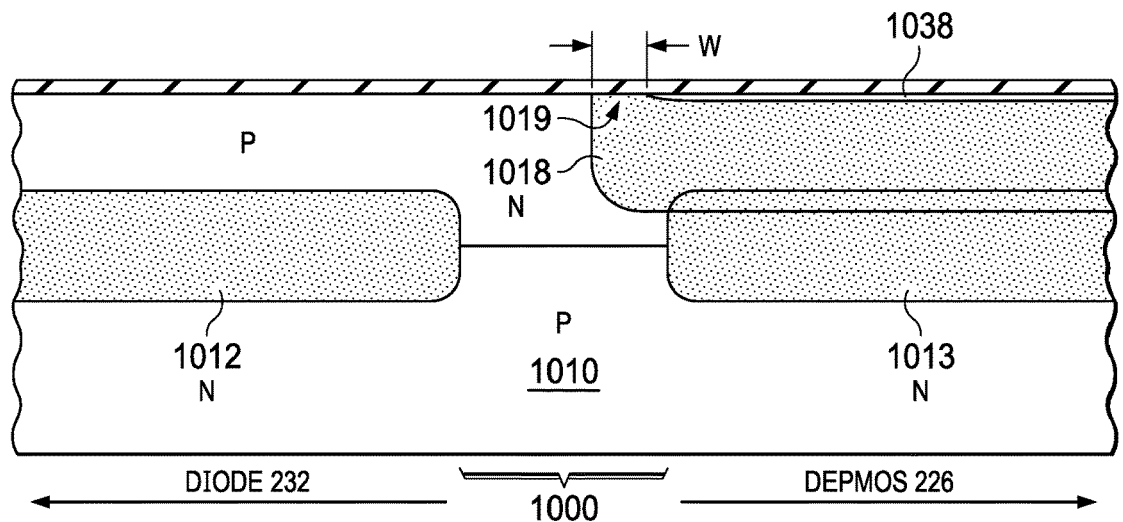
FIG. 10 is a cross section view of the gap between an example diode and an example DEPMOS transistor.

FIG. 2 is a plan view of an example driver circuit 200, which is an example of high-voltage drive circuit 100 (FIG. 1). Driver circuit 200 includes low voltage control unit 202, which is an example of low voltage control unit 102 (FIG. 1). High voltage gate driver logic 204 includes examples of both high voltage gate driver logic 104 (FIG. 1) and low side gate driver logic 108 (FIG. 1). Isolation 220 surrounds high voltage gate driver logic 204 to isolate the high voltages that occur in high voltage gate driver logic 204 from low voltage control unit 202. In addition, high voltage gate driver logic 204 includes a ring 210 of high voltage devices that includes lateral drain metal oxide semiconductor (LDMOS) transistor 222, diode 224, drain-extended p-type metal oxide semiconductor (DEPMOS) transistor 226, junction isolation diode 232, LDMOS transistor 234, and diode 236. The specific configuration of the devices in ring 210 is an example and other examples use different configurations. As indicated in FIG. 2, FIG. 4 is a cross section of junction isolation diode 232. FIG. 5 is a cross section of LDMOS transistor 222. FIG. 6 is a cross section of DEPMOS transistor 226. FIG. 10 is a cross section of a transition region 1000 between junction isolation diode 232 and DEPMOS transistor 226 when DEPMOS transistor 226 has the configuration of FIG. 8.

Figure 3:
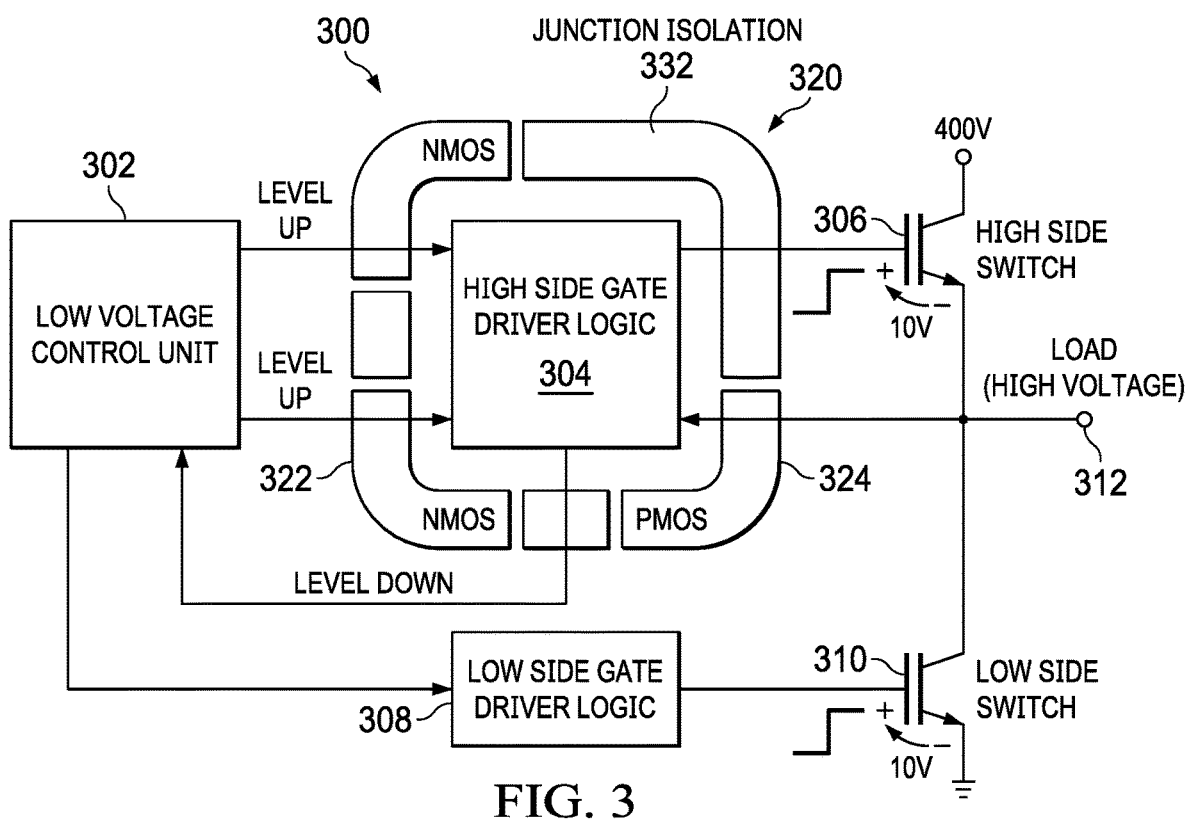
FIG. 3 is a composite schematic diagram of FIGS. 1 and 2.

FIG. 3 is a composite schematic diagram of FIGS. 1 and 2 showing example high-voltage drive circuit 300. Low voltage control unit 302 is an example of low voltage control unit 202 (FIG. 2). High side power transistor 306 is an example of high side power transistor 106 (FIG. 1). Low side power transistor 310 is an example of low side power transistor 110 (FIG. 1). Load 312 is an example of load 112 (FIG. 1). High side gate driver logic 304 is an example of high voltage gate driver logic 204 (FIG. 2). As shown in the example of FIG. 3, high side gate driver logic 304 is surrounded by a loop 320 of devices including NMOS (LDMOS) transistors 322 and 326, PMOS (DEPMOS) transistor 324 and junction isolation diode 332. Low side gate driver logic 308 is an example of low side gate driver logic 108 (FIG. 1). In the example of FIG. 3, low side gate driver logic is shown outside of loop 320. However, in this example, low side gate driver logic uses at least one transistor capable of withstanding high voltages such as PMOS transistor 324.

FIG. 4 is a cross section diagram of example junction isolation diode 400. Junction isolation diode 400 is an example of junction isolation diode 232 (FIG. 2). Substrate 404 includes a p-type crystalline silicon substrate in this example. In this example, p and n are opposite conductivity types in the crystal structure of the substrate. In other examples, substrate 404 is or includes other semiconductors such as germanium, gallium-arsenide, or indium-phosphide. Epitaxial layer 410 is a p-type layer. P-type regions are formed using a p-type dopant, such as boron. In the case of epitaxial deposition, a boron-carrying gas is used with a silicon-bearing gas during deposition. Buried layer 412 is an n-type layer that may be formed from an implantation or diffusion of n-type dopant such as phosphorus and/or arsenic into underlying substrate 404, and then forming p-type epitaxial layer 410 by epitaxial deposition. The implanted dopant diffuses into substrate 404 and epitaxial layer 410 during the formation of epitaxial layer 410 to form buried layer 412. N-well 433 is the cathode of junction isolation diode 400. N+ contact region 446 provides an ohmic contact to n-well 433 for vias 450, which connect to first metal layer 452. Field oxide layer 434, buried layer 412, and n-well 433 define drift region 405. P-well 431 is the anode of junction isolation diode 400. P+ contact region 448 provides an ohmic contact between p-well 431 and vias 450. Vias 450 connect to first metal layer 452. First metal layer 452 connects to second metal layer 458 by vias 454. In this example, first metal layer 452, second level layer 458, and vias 454 are aluminum. Other examples use other conductive materials, such as copper, titanium, tungsten, other conductors, and alloys thereof. First interlevel oxide layer 444 separates oxide layer 434, n+ contact region 446, and p+ contact region 448 from first metal layer 452. Second interlevel oxide layer 456 separates first metal layer 452 from second metal layer 458. Both first metal layer 452 and second metal layer 458 include interconnections to other components not shown in FIG. 4. FIG. 4 and subsequent figures are not drawn to scale. To provide high breakdown voltages (e.g. 600 V or greater), drift region 405 may be much longer laterally than the other components of junction isolation diode 400. Therefore, if FIG. 4 were a scale drawing, components other than drift region 405 and buried layer 412 would be difficult to discern. As with FIG. 4, FIGS. 5, 6, 8, 10, 12, and 13 are not to scale.

FIG. 5 is a cross section diagram of an example LDMOS transistor 500. LDMOS transistor 500 is an example of LDMOS transistor 222 (FIG. 2). Substrate 504 includes a p-type crystalline silicon substrate in this example. In other examples, substrate 504 is or includes other semiconductors such as germanium, gallium-arsenide, or indium-phosphide. Buried layer 512 is an n-type layer that forms from an implantation or diffusion of n-type dopant such as phosphorus and/or arsenic into underlying substrate 504, and then forming p-type epitaxial layer 510 by epitaxial deposition. P-type regions are formed using a p-type dopant, such as boron. In the case of epitaxial deposition, a boron-carrying gas is used with the silicon-bearing gas during deposition. The implanted n-type dopant diffuses into substrate 504 and epitaxial layer 510 during the formation of epitaxial layer 510 to form buried layer 512. N-well 531 extends from a surface of substrate epitaxial layer 510 to buried layer 512. Drain contact 548 is an n+ region that provides an ohmic contact between n-well 531 and via 550.

Body region 533 is a p-type region in epitaxial layer 505. N+ region 530 is adjacent to or abutting body region 533 and extends to buried layer 512. Source 546 is an n+ region formed in body region 533. On the surface of epitaxial layer 510 between source 546 and N+ region 530 is a gate oxide 525. In this example, gate oxide 525 is formed by oxidation of epitaxial layer 510. In other examples, gate oxide 525 may be formed by a deposition process. Gate oxide 525 is thinner than field oxide 534. In this example, field oxide 534 is formed by oxidation of epitaxial layer 510. In other examples, field oxide 534 may be formed by a deposition process or trench and fill processes (e.g. shallow trench isolation). Gate 540 is a patterned layer of polycrystalline silicon in this example. In other examples, gate 540 may be formed of other conductive materials such as metals.

First interlevel dielectric layer 544 may be spun-on-glass or plasma-deposited oxide. Vias 550 are formed in first interlevel dielectric layer 544 by etching first interlevel dielectric layer 544 using a resist level patterned using a photolithographic mask, then filling the resulting openings in first interlevel dielectric layer 544 with a conductive material, such as titanium-tungsten. Vias 550 contact body contact 545, source 546, gate 540, and drain contact 548. Specific interconnections are examples and different connections to LDMOS transistor 500 are implemented in other examples. First metal layer 552 is deposited on first interlevel dielectric layer 544 and patterned using photolithography and etching. In this example, first metal layer 552 is aluminum. Other examples use other conductive materials, such as copper, titanium, tungsten, other conductors, and alloys thereof. Additional portions of first level metal layer show that first metal layer 552 is used for interconnections in other components in an integrated circuit containing LDMOS transistor 500 in this example. Second interlevel dielectric layer 556 is formed using spun-on-glass or plasma-deposited oxide on first interlevel dielectric layer 544 and first metal layer 552. Vias 554 are formed in second interlevel dielectric layer 556 by etching second interlevel dielectric layer 556 using a photolithographic mask, then filling the resulting openings in second interlevel dielectric layer 556 with a conductive material, such as titanium-tungsten. Second metal layer 558 is deposited on second interlevel dielectric layer 556 and patterned using photolithography and etching. In this example, second metal layer 558 is aluminum. Other examples use other conductive materials, such as copper, titanium, tungsten, other conductors, and alloys thereof. Additional portions of second metal layer 558 show that second metal layer 558 is used for interconnections in other components in an integrated circuit containing LDMOS transistor 500. Vias 554 connect leads in first metal layer 552 to leads in second metal layer 558. In this example, multiple vias 554 provide high conductivity and high current carrying capacity.

In operation, a voltage applied to gate 540 causes a channel to form under gate 540 from source 546, through p body region 533 to n+ region 530. Because LDMOS transistor 500 is an n-channel device, electrons (as opposed to holes) are the primary carriers when LDMOS transistor 500 is conductive. The path of least resistance for these electrons is through n+ region 530, through buried layer 512, through n-well 531 to drain contact 548. Because the flow of electrons is away from field oxide 534, the conduction path of LDMOS transistor 500 does not cause reliability problems at the interface between field oxide 534 and epitaxial layer 510. Body contact 545 is a p+ region in body region 533 that allows ohmic contact of via 550 to body region 533. In this example, body contact 545 and source 546 connect to the same lead in first level metal layer 552, and thus are tied together. In other examples, body contact 545 is used to modulate the threshold voltage of LDMOS transistor 500 by applying a bias voltage to body contact 545. Barrier well 528 is an n+ well between field oxide 534 and buried layer 512. Barrier well 528 along with isolation well 536 help isolate LDMOS transistor 500 from other components formed in epitaxial layer 510 on the drain side of LDMOS transistor 500. Isolation well contact 547 provides an ohmic connection to isolation well 536, when needed. Buried isolation region 506 helps isolate LDMOS transistor 500 from other components in epitaxial layer 510 on the source side of LDMOS transistor 500.

FIG. 6 is a cross section diagram of an example baseline DEPMOS transistor 600. DEPMOS transistor 600 is an example of DEPMOS transistor 226 (FIG. 2). Substrate 604 includes a p-type crystalline silicon substrate in this example. In other examples, substrate 604 is or includes another semiconductor such as germanium, gallium-arsenide, or indium-phosphide. First buried layer 612, buried regions 616, and second buried layer 606 are n-type layers that form from an implantation or diffusion of n-type dopant such as phosphorus and/or arsenic into underlying substrate 604, and then forming p-type epitaxial layer 610 by epitaxial deposition. P-type regions are formed using a p-type dopant, such as boron. In the case of epitaxial deposition, a boron-carrying gas is used with the silicon-bearing gas during deposition. The implanted n-type dopant diffuses into substrate 604 and epitaxial layer 610 during the formation of epitaxial layer 610 to form first buried layer 612, buried regions 616, and second buried layer 606. A drift region 605 extends between a source 646 and drain 630 formed within the epitaxial layer 610. Buried regions 616 are implanted with a width and spacing such that after diffusion of the implanted dopants a graded buried layer is formed with a greater dopant concentration toward the source and a lesser concentration toward the drain. Such a distribution of dopants may shape the electric field limit a maximum value of the field in the drift region 605 during operation.

Drain 630 includes multiple diffusions. Multiple diffusions increase the interface area between drain 630 and epitaxial layer 610 in drift region 605, which lowers the impedance of the transition from drift region 605 to drain 630 and p+ drain contact 648. In addition, the greater interface area between drain 630 and drift region 605 spreads the electric field applied to drain 630 over a greater area, thus increasing the breakdown voltage of DEPMOS transistor 600.

Body region 620 is n-type and extends from a surface of epitaxial layer 610 to buried layer 612. Source 646 is a p+ region formed in body region 620. Body contact 645 is an n+ region that provides ohmic contact between body region 620 and via 650. Field oxide 634 is on the surface of epitaxial layer 610 except where via 650 contacts drain contact 648, where source 646 and body contact 645 are located, and where gate oxide 625 is located. In this example, field oxide 634 is formed by oxidation of epitaxial layer 610. In other examples, field oxide 634 is formed by a deposition process or trench and fill processes. On the surface of epitaxial layer 610 between source 646 and drift region 605 is gate oxide 625. In this example, gate oxide 625 extends beyond body region 620 and is formed by oxidation of epitaxial layer 610. In other examples, gate oxide 625 is formed by a deposition process. Gate oxide 625 is thinner than field oxide 634. In one example, gate oxide 625 is about 50 nm thick and field oxide 634 is about 1 μm thick. Gate 640 is a patterned layer of polycrystalline silicon about 800 nm in this example. In other examples, gate 640 is formed of other conductive materials such as metals. Field plate 642 is also polycrystalline silicon in this example. Field plate 642 is connected to first level metal by via 650 and helps control excessive electric fields at the interface between drain 630 and drift region 605. Elements of DEPMOS transistor 600 couple to first level metal 652 through vias 650. First level metal 652 couple to second level metal 658 through vias 654. In this example, first level metal 652, second level metal 658, and vias 650 are aluminum. Other examples use other conductive materials, such as copper, titanium, tungsten, other conductors, and alloys thereof. First level metal 652 is separated from the surface of epitaxial layer 610 by first interlevel dielectric 644. First level metal 652 is separated from second level metal by second interlevel dielectric 656.

The inventors have recognized that a reliability issue may exist with the baseline DEPMOS transistor 600. In the baseline DEPMOS transistor 600, the primary carriers are holes that flow from source 646, through a channel in body region 620 formed by a voltage applied to gate 640, and along the interface between field oxide 634 and epitaxial layer 610 in drift region 605 to drain 630. When DEPMOS transistor 600 is off (not conducting), there is a large voltage difference between body region 620 and drift region 605. This voltage difference may generate hot electrons that sometimes embed in gate oxide 625 and/or field oxide 634. These hot electrons can damage the oxide material and cause a pseudo-channel in DEPMOS transistor 600 that can increase the current of DEPMOS transistor 600.

Figure 7:
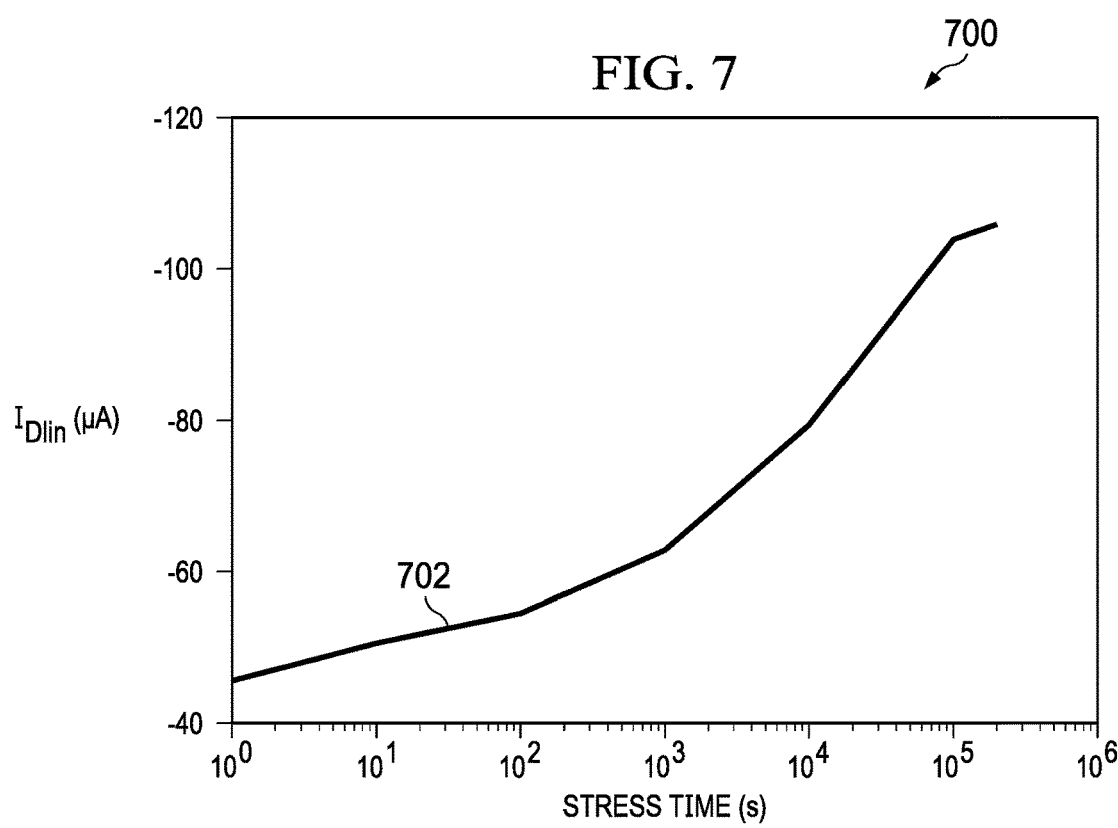
FIG. 7 is a graph of a reliability test indicating the baseline DEPMOS transistor of FIG. 6 lacks a desired level of stability under room temperature reverse bias (RTRB) conditions.

FIG. 7 presents results of a room temperature reverse bias (RTRB) reliability test performed on a representative instance of the baseline DEPMOS transistor 600. Graph 700 shows the current under reverse bias on the vertical axis and the time of stress (by applying the reverse bias) on the horizontal axis. For this test, a reverse bias voltage of, for example, 600V is applied to DEPMOS transistor 600. The positive 600 V is applied to the source 646 (FIG. 6) of DEPMOS transistor 600 (FIG. 6). Ground (zero volts) is applied to drain 630 (FIG. 6) of DEPMOS transistor 600 (FIG. 6). This provides a reverse bias voltage from body region 620 to drift region 605, which is a circumstance where hot electrons are generated. As shown by line 702, the linear region current $I_{dlin}$ current rises over time, indicating that significant hot electrons are embedding in field oxide 634 (FIG. 6) and/or gate oxide 625 (FIG. 6) over the course of the electrical stress period.

In the on-state, the current through DEPMOS transistor 600 is about 150 μA to 200 μA. Circuit designers rely on the relative stability of the operating characteristics of components to produce their designs. However, graph 700 shows that, with prolonged application of reverse bias, $I_{dlin}$ varies significantly in the baseline DEPMOS transistor 600 (FIG. 6). This change in characteristics of DEPMOS transistor 600 (FIG. 6) can create significant changes to the operation of circuits including DEPMOS transistor 600 (FIG. 6) that can lead to circuit failure.

Figure 8:
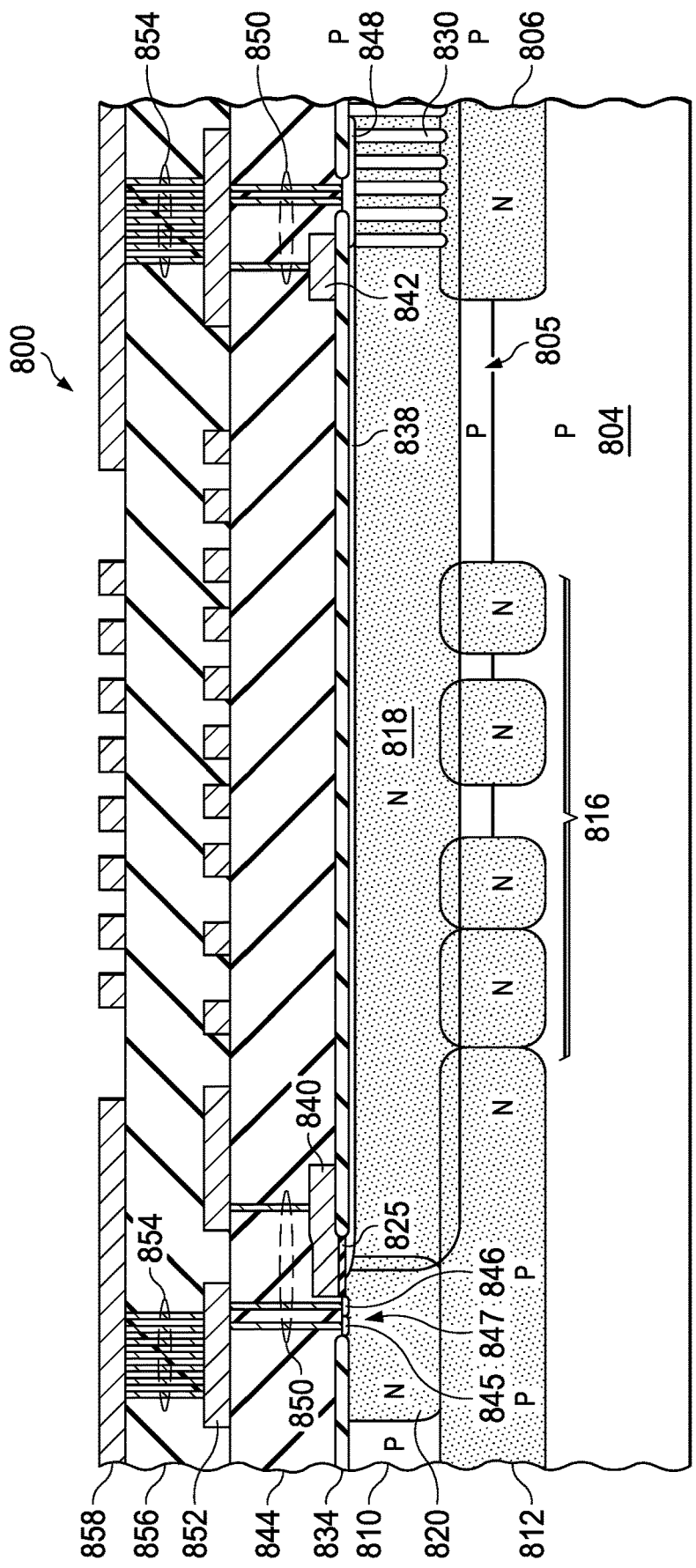
FIG. 8 is a cross section diagram of an example DEPMOS transistor according to the disclosure.

FIG. 8 is a cross section diagram of an example DEPMOS transistor 800 that includes some features presented in the disclosure. Many of the features of the DEPMOS transistor 800 are analogous to those of the baseline DEPMOS transistor 600. Substrate 804 includes a p-type crystalline silicon substrate in this example. In other examples, substrate 804 is or includes other semiconductors, such as germanium, gallium-arsenide, or indium-phosphide. First buried layer 812, buried regions 816, and second buried layer 806 are n-type layers that form from an implantation or diffusion of n-type dopant such as phosphorus and/or arsenic into underlying substrate 804, and then forming p-type epitaxial layer 810 by epitaxial deposition. P-type regions are formed using a p-type dopant, such as boron. In the case of epitaxial deposition, a boron-carrying gas is used with the silicon-bearing gas during deposition. The implanted n-type dopant diffuses into substrate 804 and epitaxial layer 810 during the formation of epitaxial layer 810 to form first buried layer 812, buried regions 816, and second buried layer 806. Buried regions 816 are implanted and may diffuse to form a graded buried layer as described previously.

Drain 830 includes p-type regions in epitaxial layer 810. Drain 830 includes multiple diffusions to increase the interface area between drain 830 and epitaxial layer 810 in drift region 805. This increased surface area lowers the impedance from drift region 805 to drain 830 and p+ drain contact 848. In addition, the greater interface area between drain 830 and drift surface layer 838 spreads the electric field applied to drain 830 over a greater area, thus increasing the breakdown voltage of DEPMOS transistor 800.

Body region 820 is n-type and extends from a surface of epitaxial layer 810 to first buried layer 812. Source 846 is a p+ region formed in body region 820. Body contact 845 is an n+ region to provide ohmic contact between body region 820 and via 850. Field oxide 834 is on the surface of epitaxial layer 810 except where via 850 contacts drain contact 848, where source 846 and body contact 845 are located, and where gate oxide 825 is located. In this example, field oxide 834 is formed by oxidation of epitaxial layer 810. In other examples, field oxide 834 is formed by a deposition process or trench and fill processes. On the surface of epitaxial layer 810 between source 846 and drift region 805 is gate oxide 825. In this example, gate oxide 825 extends over the diffusion region 805 and is formed by oxidation of epitaxial layer 810. In other examples, gate oxide 825 is formed by a deposition process. Gate oxide 825 is thinner than field oxide 834. In one example, gate oxide 825 is about 50 nm thick and field oxide 834 is 1 μm thick. Gate 840 is a patterned layer of polycrystalline silicon about 800 nm thick, in this example. In other examples, gate 840 is formed of other conductive materials such as metals. Field plate 842 is also polycrystalline silicon in this example. Field plate 842 is connected to first level metal by via 850 and helps control excessive electric fields at the interface between drain 830 and drift region 805. Elements of DEPMOS transistor 800 couple to first level metal 852 through vias 850. First level metal 852 couples to second level metal 858 through vias 854. First level metal 852 is separated from the surface of epitaxial layer 810 by first interlevel dielectric 844. First level metal 852 is separated from second level metal by second interlevel dielectric 856.

Drift well 818 is an n-type region formed in drift region 805 and may be doped with an n-type dopant at a concentration of $3-4 \times 10^{12}$ atoms/cm$^3$. In this example, drift well 818 extends from body region 820 to beyond drain 830. Drift surface layer 838 is a p+ doped region between drift well 818 and field oxide 834 having a dopant concentration of about $1 \times 10^{17}$ atoms/cm$^3$, or more than four orders of magnitude greater than the drift well 818. Drift surface layer 838 extends from body region 820 to drain 830. In this example, drift surface layer 838 extends beyond drift well 818 and over the body region 820 where it is spaced apart from source 846 by channel region 847 of DEPMOS transistor 800.

Figure 9:
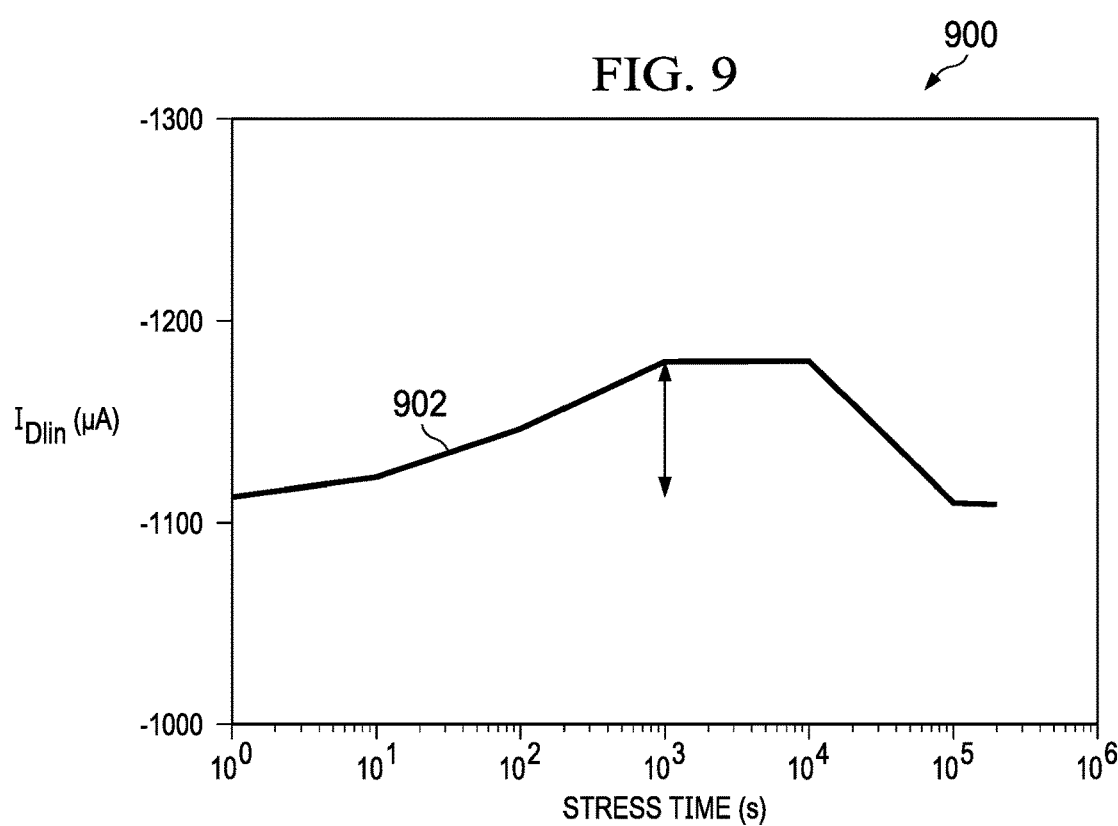
FIG. 9 is a graph of a reliability test indicating the example DEPMOS transistor of FIG. 7 has a desired level of stability under RTRB conditions.

The p-type dopant concentration of epitaxial layer 610 (FIG. 6) in the example baseline DEPMOS transistor 600 of FIG. 6 is about $2 \times 10^{15}$ atoms/cm$^3$. Thus, the dopant concentration of drift surface layer 838, and thus the availability of carriers (holes) in drift surface layer 838 is nearly two orders of magnitude greater than that of drift region 605 (FIG. 6). This means that, as shown in the graph of FIG. 9, the off-current, or reverse bias current, of the example of DEPMOS transistor 800 is about two and one-half orders of magnitude greater than that of baseline DEPMOS transistor 600 (FIG. 6). However, the on-current of the example of DEPMOS transistor 800 is also about two and one-half orders of magnitude greater than the on-current of baseline DEPMOS transistor 600 (FIG. 6). Because of the larger off-current of DEPMOS transistor 800 (FIG. 8), the increase of $I_{dlin}$ caused by hot electrons is relatively small, as shown by line 902 of graph 900, which shows the results of an RTRB test on DEPMOS transistor 800 (FIG. 8). Thus, even though the off-current of DEPMOS transistor 800 (FIG. 8) is greater than the off-current of DEPMOS transistor 600 (FIG. 6), because the off-current of DEPMOS transistor 800 (FIG. 8) is relatively stable, even with the effects of hot electrons, the difference between the on-current and off-current of DEPMOS transistor 800 (FIG. 8) is relatively small. Therefore, the operation of DEPMOS transistor 800 (FIG. 8) is expected to be more reliable than the operation of DEPMOS transistor 600 (FIG. 6).

While the presence of the surface layer 838 is expected to desirably increase stability of $I_{dlin}$ over the life of the DEPMOS transistor 800, the inventors have discovered that in some cases the surface layer 838 may result in reduced breakdown voltage of the DEPMOS transistor 800 at the source 846 or drain 830. The inventors have further determined that this effect may be mitigated by certain aspects of transition region 1000 between the DEPMOS transistor 800 and a neighboring component such as the junction isolation diode 232.

FIG. 10 is a cross section view of the transition region 1000, previously shown in FIG. 2, between junction isolation diode 232 (FIG. 2) and DEPMOS transistor 226 (FIG. 2) where DEPMOS transistor 226 (FIG. 2) has the configuration of DEPMOS transistor 800 (FIG. 8). Buried layer 1012 is an example of buried layer 412 of the junction isolation diode 400 (FIG. 4). Buried layer 1013 is an example of first buried layer 812 (FIG. 8), second buried layer 806 (FIG. 8), or buried regions 816 (FIG. 8). Drift well 1018 is an example of drift well 818 (FIG. 8). Drift surface layer 1038 is an example of drift surface layer 838 (FIG. 8).

The transition region 1000 is shown in FIG. 10 as the space between the buried layer 1013 of the DEPMOS transistor 800 and the buried layer 1012 of the junction isolation diode 400, which is an adjacent device as shown in FIG. 2. In principle the width of the transition region 1000 is not limited to any particular value. Balancing the interest in isolating the junction isolation diode 400 from the DEPMOS transistor 800 while achieving a compact design, a distance of 10 μm between the buried layer 1012 and the buried layer 1013 may provide acceptable results.

As shown in FIG. 10, drift well 1018 includes extension 1019 that extends toward the buried layer 1012 beyond drift surface layer 1038 by a distance W. FIG. 10 also shows an optional configuration in which the drift well 1018 extends past the buried layer 1013 toward the buried layer 1012. The extension 1019 surrounds drift surface layer 1038 (or surface layer 838) except where drift surface layer 1038 (or surface layer 838) is adjacent to channel region 847 (FIG. 8). Thus, the drift well extends beyond the drift surface layer along a periphery of the drift well. Three-dimensional field modeling predicts that the presence of the extension 1019 may prevent premature breakdown at or near the source 846 or drain 830 by advantageously redistributing electric fields within the DEPMOS transistor 800. While any nonzero value of W may confer this advantage, a value of about 1 μm is expected to provide sufficient protection from premature breakdown without excessive consumption of device area.

Figure 11A:
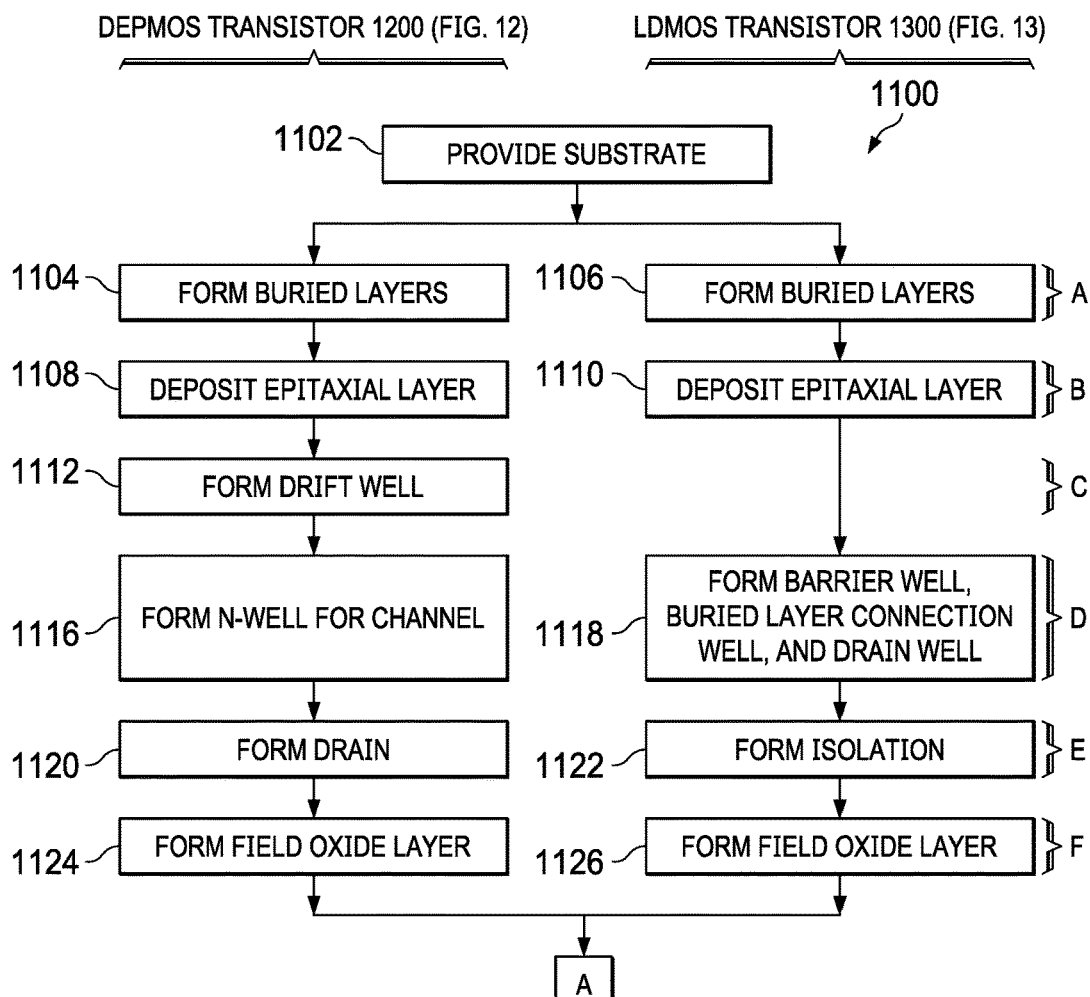
FIGS. 11A and 11B (collectively "FIG. 11") are a flow diagram for an example fabrication process.
Figure 11B:
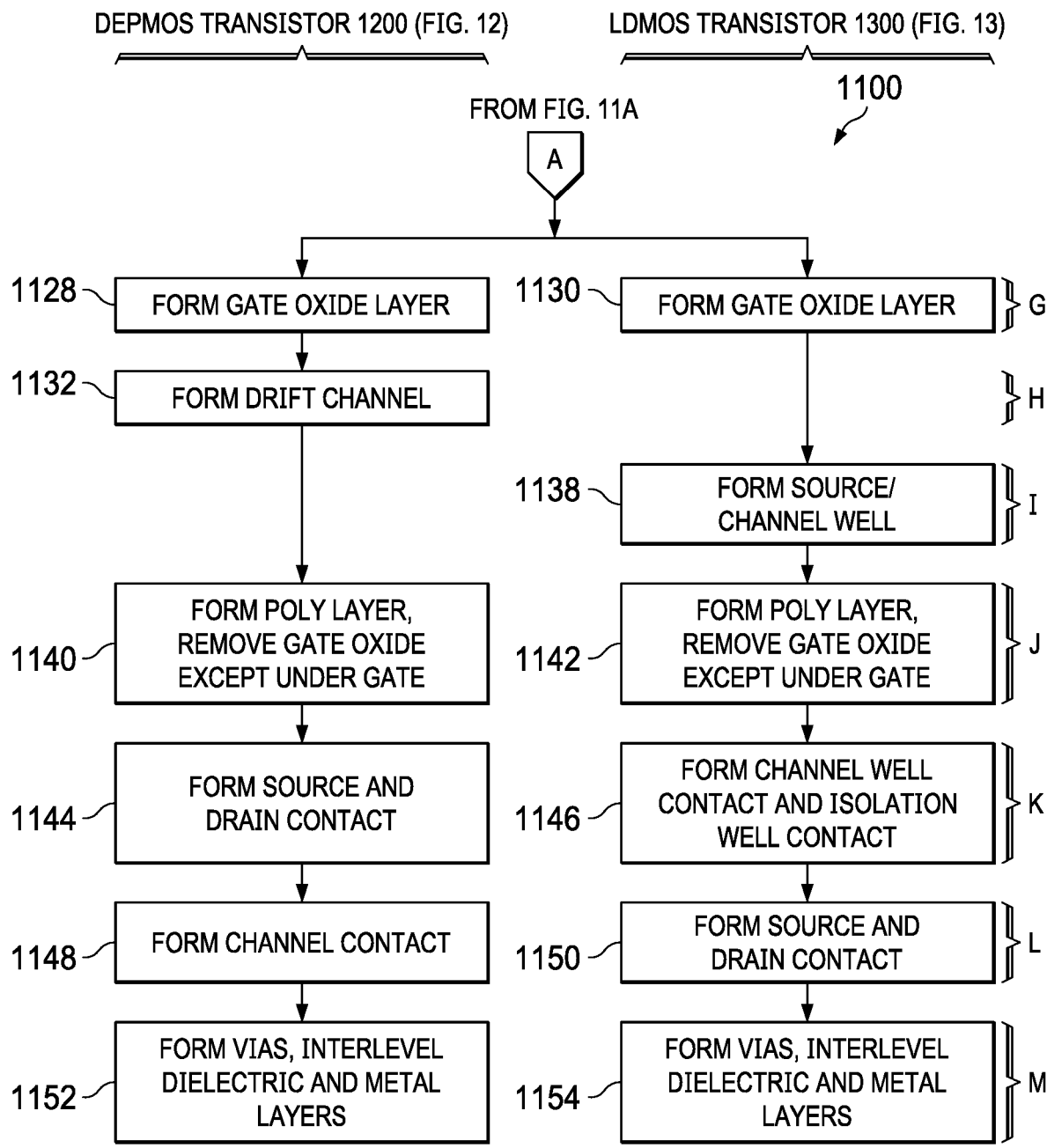

Moving to FIGS. 11A and 11B (collectively "FIG. 11"), a flow diagram is presented for an example fabrication process 1100. Process 1100 includes the steps for forming two devices: a DEPMOS transistor 1200 (FIG. 12) and an LDMOS transistor 1300 (FIG. 13). The steps for forming the DEPMOS transistor 1200 (FIG. 12) are in the left column of FIG. 11. FIGS. 12A-M (collectively "FIG. 12") illustrate the steps for forming the DEPMOS transistor 1200 (FIG. 12). The steps for forming an LDMOS transistor 1300 (FIG. 13) are in the right column of FIG. 11. FIGS. 13A-M (collectively "FIG. 13") illustrate the steps for forming the LDMOS transistor 1300 (FIG. 13). FIGS. 11-13 show the fabrication of two types of devices contemporaneously to demonstrate that these two devices can be formed in the same integrated circuit using substantially the same process. This process can also be used to fabricate other devices on the same integrated circuit, such as junction isolation diode 400 (FIG. 4). However, FIGS. 11-13 are limited to two devices for simplicity. As discussed in detail in the following description, process steps that are in the same row of FIG. 11 are performed contemporaneously using the same implantation, oxidation, or other process in both the DEPMOS transistor 1200, as illustrated in FIG. 12, and the LDMOS transistor 1300, as illustrated in FIG. 13. For example, the following discussion introduces the process steps, such as step 1104 and step 1106, which are in a row labeled A, along with the corresponding illustration in FIGS. 12 and 13, in this case FIG. 12A and FIG. 13A, respectively. Thus, the row labels of FIG. 11 correspond to the alphabetical labels in FIGS. 12 and 13.

Step 1102 is providing a substrate for both DEPMOS transistor 1200 (FIG. 12) and LDMOS transistor 1300 (FIG.

Figure 12A:
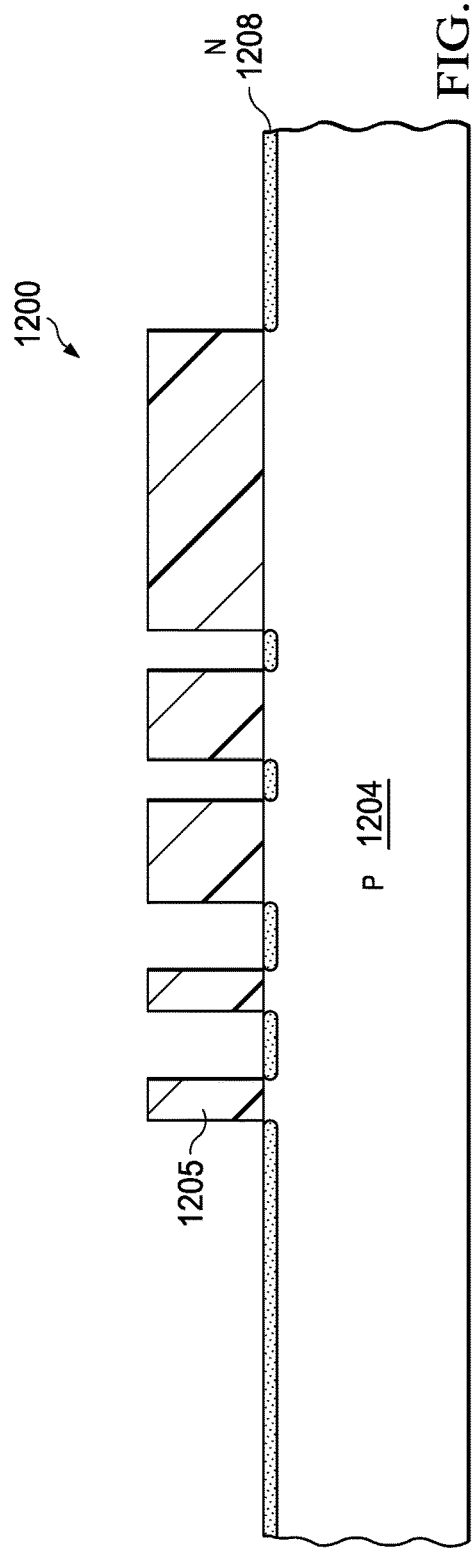
Figure 13A:
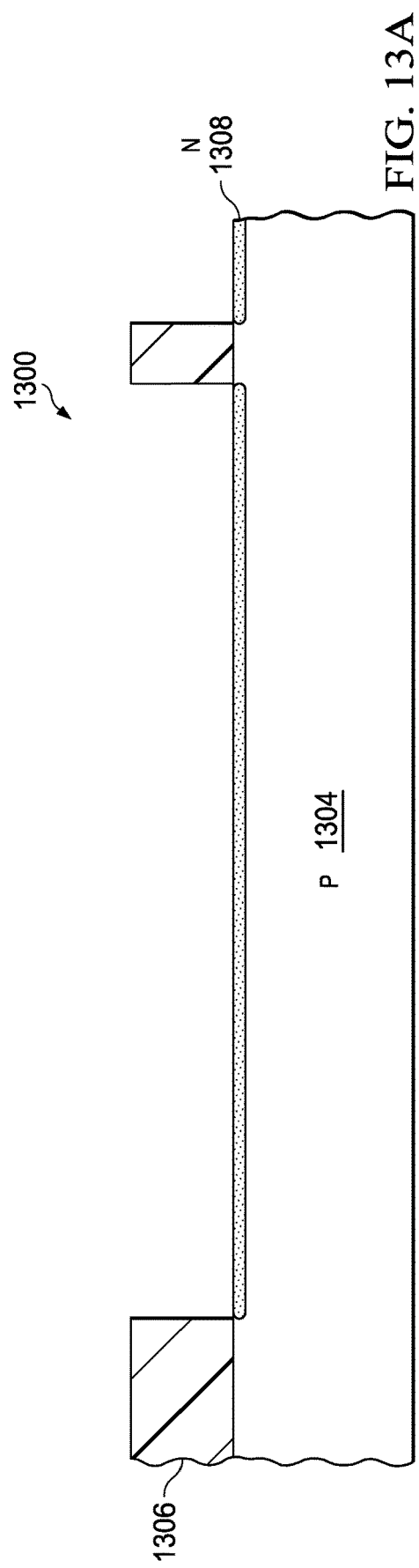

13). Thus, step 1102 is centered in FIG. 11 because it applies equally to FIG. 12 and FIG. 13. In addition, centering of step 1102 indicates that it is the same substrate for both devices. Step 1102 provides substrate 1204 as shown in FIG. 12A and substrate 1304 as shown in FIG. 13A. Substrate 1204 and substrate 1304 are p-type crystalline silicon in this example. In other examples, substrate 1204 and substrate 1304 may be or include other semiconductors, such as germanium, gallium-arsenide, or indium-phosphide. Step 1104 is forming buried layers for DEPMOS transistor 1200. A mask 1205 is formed and patterned on the surface of substrate 1204 using photolithography. Using mask 1205, n-type dopant atoms are implanted in substrate 1204 as shown in FIG. 12A, to produce implantations 1208. In this example, arsenic ions are implanted at an energy of 40 keV at a density of $8.0 \times 10^{12}$ atoms/cm$^2$. Step 1106 is forming buried layers for LDMOS transistor 1300. In this example, step 1106 occurs contemporaneously with step 1104. In this example, a mask 1306 is formed on the surface of substrate 1304 using photolithography. In this example, mask 1306 is used for the same implantation of arsenic ions are implanted at an energy of 40 keV at a density of $8.0 \times 10^{12}$ atoms/cm$^2$ arsenic ions used in step 1104 to form implantation 1308.

For simplicity, the following explanation of the steps of process 1100 does not explicitly state that a process in a figure of FIG. 12 that is identical or similar to a process in a corresponding figure of FIG. 13 is the same process or is at least performed contemporaneously. In other examples, any process step shown in FIG. 12 may occur at a different time than the corresponding process step in FIG. 13. However, each additional step of a semiconductor manufacturing process provides an additional risk of error and/or contamination, thus reducing manufacturing yield. Therefore, to minimize the number of steps in the example process illustrated in FIGS. 12 and 13, the steps in FIG. 12 that are identical or similar to the steps in the corresponding illustration in FIG. 13 are contemporaneous.

Step 1108 is forming an epitaxial layer for DEPMOS transistor 1200. Mask 1205 is removed from substrate 1204. As shown in FIG. 12B, epitaxial layer 1210 is formed on underlying substrate 1204. P-type dopant atoms are included with the silicon source gas in forming epitaxial layer 1210. Therefore, epitaxial layer 1210 is p-type. Step 1110 is forming an epitaxial layer for LDMOS transistor 1300. Mask 1306 is removed from substrate 1304. As shown in FIG. 13B, epitaxial layer 1310 is formed on underlying substrate 1304. P-type dopant atoms are included with the silicon source gas in forming epitaxial layer 1310. Therefore, epitaxial layer 1310 is p-type.

Figure 12D:
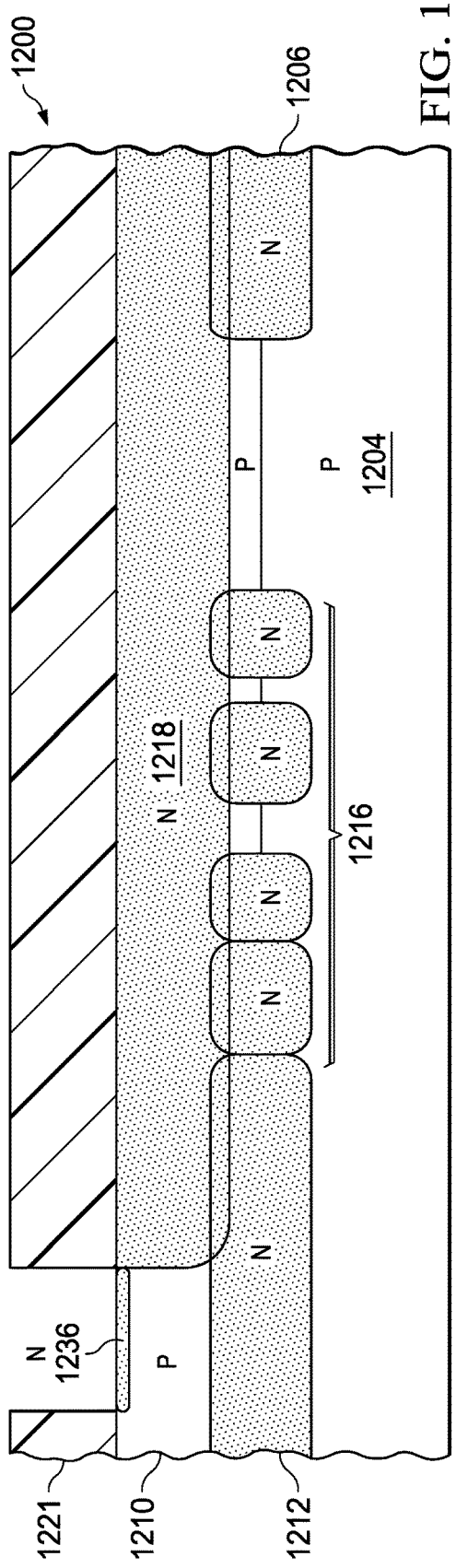
Figure 13D:
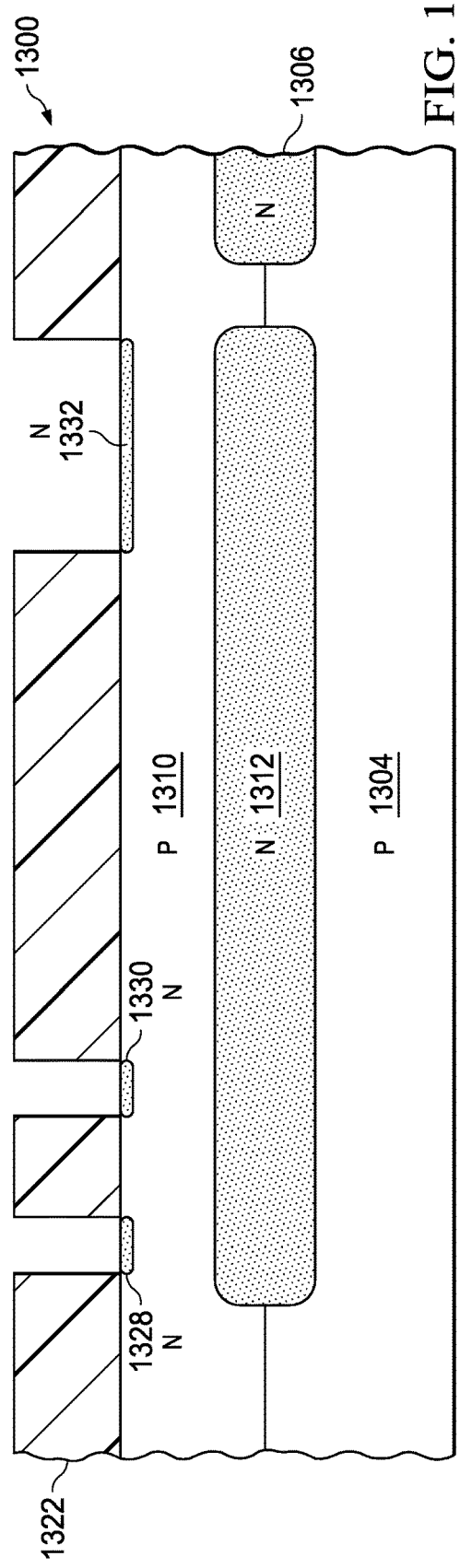

Step 1112 is forming a drift well for DEPMOS transistor 1200. Mask 1213 is formed on the surface of epitaxial layer 1210, which is used to implant n-type region 1217, as shown in FIG. 12C, which is driven in to form drift well 1218 (FIG. 12D). In this example, this implantation is of phosphorus at an energy of 40 keV and a density of $4.0 \times 10^{12}$ atoms/cm$^2$. Also shown in FIG. 12C are first buried region 1212, buried regions 1216 and second buried region 1206. These regions are formed during step 1108 and a drive-in step (not shown) and are the result of the diffusion of implantations 1208. The surface of epitaxial layer 1310 is covered by mask 1314 during the formation of n-type region 1217, so LDMOS transistor 1300 is not implanted in this step. However, buried region 1312 is formed from implantation 1308 contemporaneously with the drive-in that forms first buried region 1212, buried regions 1216 and second buried region 1206. In an alternative example, first buried region 1212, buried regions 1216 and second buried region 1206 are a continuous region that has a graded dopant concentration that increases toward the source and decreases toward the drain.

Figure 12E:
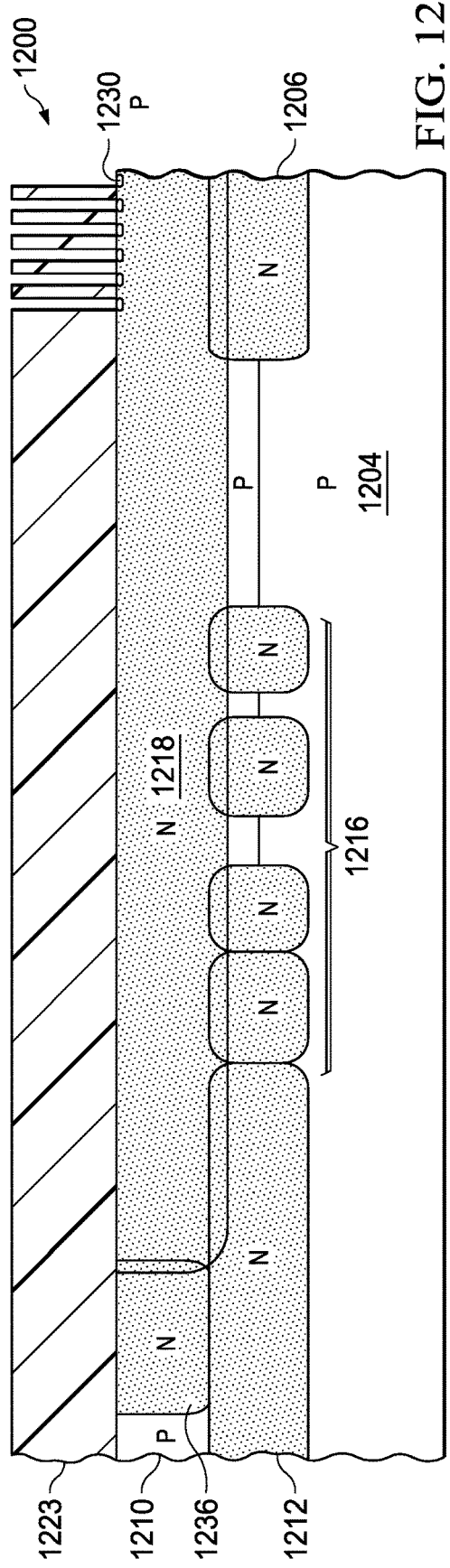
Figure 13E:
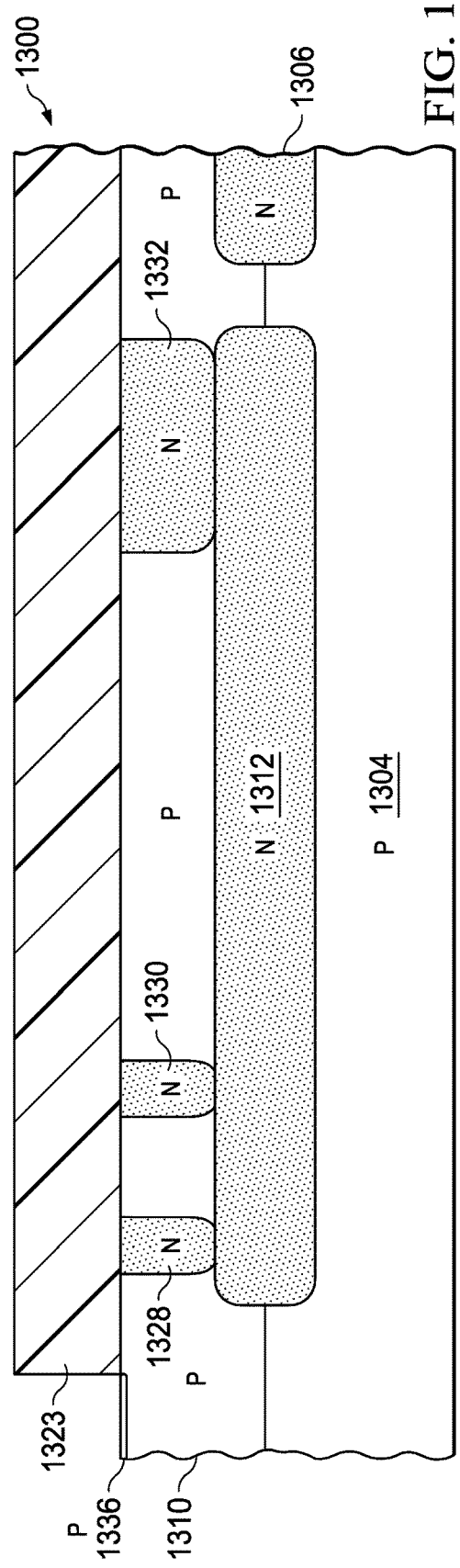

Step 1116 is forming a body region for DEPMOS transistor 1200. Mask 1221 is formed using photolithography on the surface of epitaxial layer 1210. An implantation of n-type dopant, such as phosphorus at an energy of 80 keV and a density of $6.0 \times 10^{13}$ atoms/cm$^2$, forms body region 1236. A subsequent drive-in step extends body region 1236 as shown in FIG. 12E. Step 1118 is forming a barrier well, buried layer connection well, and a drain well for LDMOS transistor 1300. Photolithography forms mask 1322 on epitaxial layer 1310. An implantation of n-type dopant, such as phosphorus at an energy of 80 keV and a density of $6.0 \times 10^{13}$ atoms/cm$^2$, forms barrier well 1328, buried layer connection well 1330, and drain well 1332. A subsequent drive-in step extends barrier well 1328, buried layer connection well 1330, and drain well 1332 to buried region 1312 as shown in FIG. 13E.

Step 1120 is forming a drain for DEPMOS transistor 1200. Mask 1221 is removed and photolithography forms mask 1223. An implantation of p-type dopant atoms, such as boron, at an energy of 80 keV and a density of $8.0 \times 10^{13}$ atoms/cm$^2$ forms drain 1230. A subsequent drive-in step extends drain 1230 into epitaxial layer 1210 as shown in FIG. 12F. Step 1122 is forming an isolation region for LDMOS transistor 1300. Mask 1322 is removed and photolithography forms mask 1323 on epitaxial layer 1310. An implantation of p-type dopant atoms, such as boron, at an energy of 80 keV and a density of $8.0 \times 10^{13}$ atoms/cm$^2$ forms isolation well 1336. A subsequent drive-in step extends isolation well 1336 into epitaxial layer 1310 as shown in FIG. 13F.

Step 1124 is forming a field oxide layer for DEPMOS transistor 1200. Mask 1223 is removed and photolithography forms mask 1232. In an example, the surface of epitaxial layer 1210 that is not covered by mask 1232 is subjected to high temperature, such as 800-1100° C., in an oxidizing environment, such as steam, to form field oxide 1234 to a thickness of 700 nm, as shown in FIG. 12F. In another example, a shallow trench is formed where epitaxial layer 1210 is not covered by mask 1232 and the shallow trench is filled with approximately 700 nm of deposited oxide, such as tetraethyl orthosilicate (TEOS). Step 1126 is forming a field oxide for LDMOS transistor 1300. Mask 1323 is removed and photolithography forms mask 1324. In an example, the surface of epitaxial layer 1310 that is not covered by mask 1324 is subjected to high temperature, such as 800-1100° C., an oxidizing environment, such as steam, to form field oxide 1334 to a thickness of 7 000 nm, as shown in FIG. 13F. In another example, a shallow trench is formed where epitaxial layer 1310 is not covered by mask 1324 and the shallow trench is filled with approximately 700 nm of deposited oxide, such as tetraethyl orthosilicate (TEOS).

Step 1128 is forming a gate oxide for DEPMOS transistor 1200. Mask 1232 is removed and the portions of the surface of epitaxial layer 1210 not covered by field oxide 1234 are subjected to an oxidizing environment, such as high temperature steam, to oxidize the exposed surfaces of epitaxial layer to produce gate oxide 1225 to a thickness of, for example, 20 nm to 50 nm, as shown in FIG. 12G. Step 1130 is forming a gate oxide for LDMOS transistor 1300. Mask 1324 is removed and the portions of the surface of epitaxial layer 1310 not covered by field oxide 1334 are subjected to an oxidizing environment, such as high temperature steam, to oxidize the exposed surfaces of epitaxial layer to produce gate oxide 1325 to a thickness of, for example, 20 nm to 50 nm, as shown in FIG. 13G.

Step 1132 is forming a drift surface layer for DEPMOS transistor 1200. Photolithography forms mask 1237 on epitaxial layer 1210 as shown in FIG. 12H. An ion implantation of boron atoms having an energy of 50 keV and a density of $2.0 \times 10^{18}$ atoms/cm$^2$ forms drift surface layer 1238 to a depth of 50 nm to 60 nm after drive-in. Mask 1337 prevents this ion implantation from affecting the epitaxial layer 1310 of LDMOS transistor 1300 as shown in FIG. 13H.

Figure 12I:
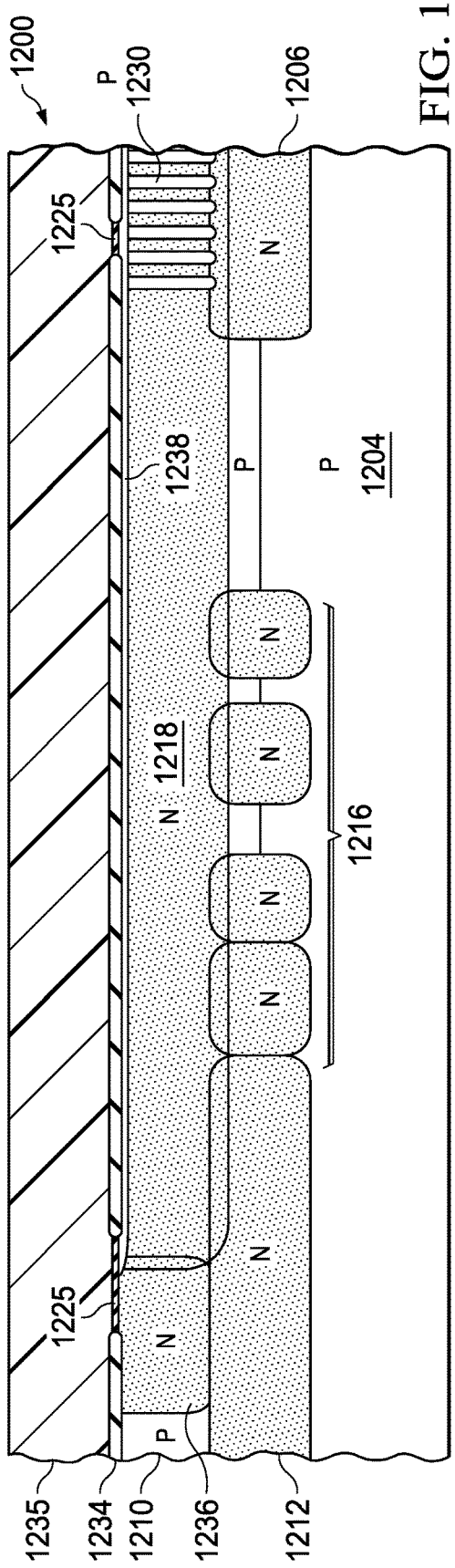
Figure 13I:
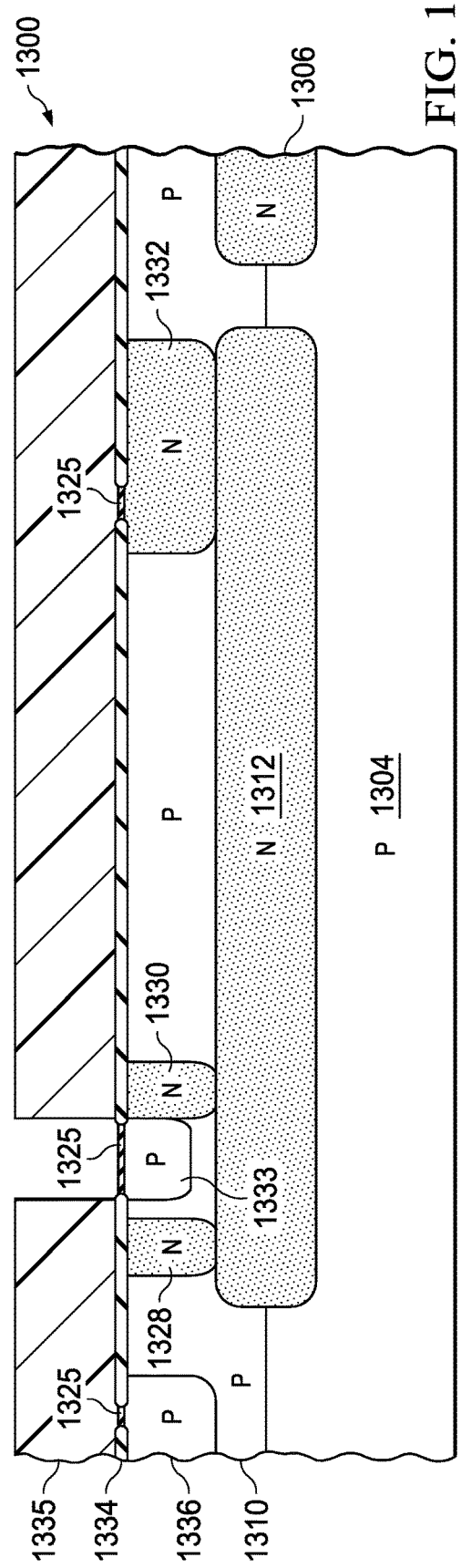

Step 1138 is forming a body region for LDMOS transistor 1300. Photolithography forms mask 1335 as shown in FIG. 13I. An ion implantation of boron atoms having an energy or 80 keV and a density of $4.0 \times 10^{14}$ atoms/cm$^2$ forms body region 1333 to a depth of about 200 nm after drive-in. Mask 1235 prevents this implantation from affecting DEPMOS transistor 1200, as shown in FIG. 12I.

Step 1140 forms a patterned polycrystalline layer and removes the gate oxide except under the gate for DEPMOS transistor 1200. As shown in FIG. 12J, a polycrystalline layer is deposited and patterned using a photolithographic mask (not shown) and etching to form gate 1220 and field plate 1222. A plasma etching process then removes the portions of gate oxide 1225 except under gate 1220. Step 1142 forms a patterned polycrystalline layer and removes the gate oxide except under the gate for LDMOS transistor 1300. As shown in FIG. 13J, a polycrystalline layer is deposited and patterned using a photolithographic mask (not shown) and etching to form gate 1340. A plasma etching process then removes the portions of gate oxide 1325 except under gate 1340.

Figure 12K:
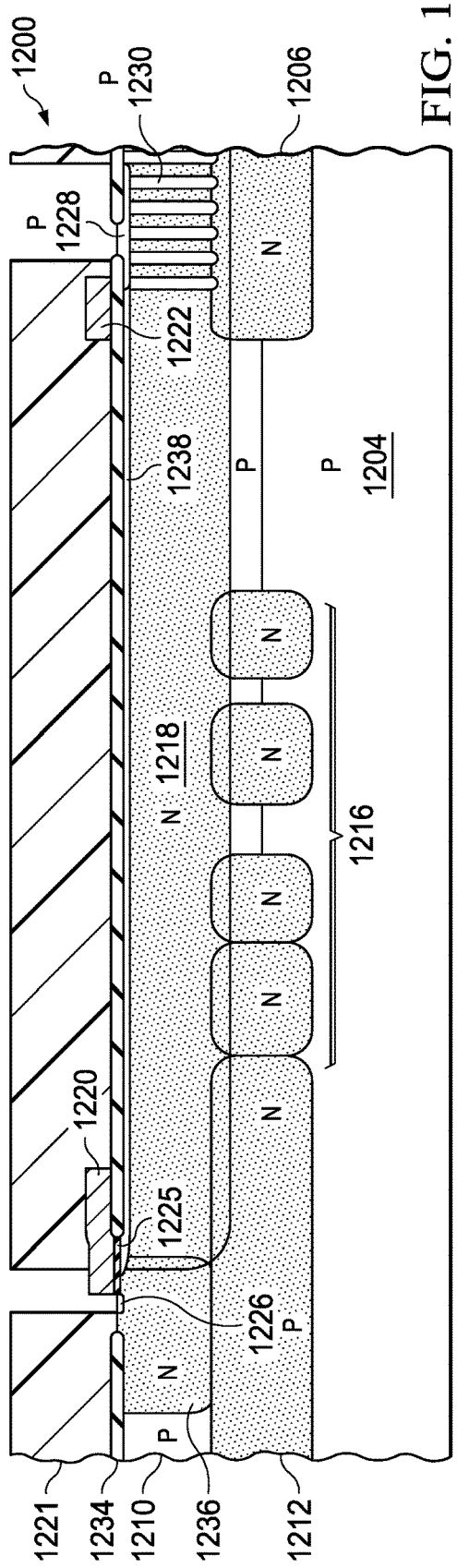
Figure 13K:
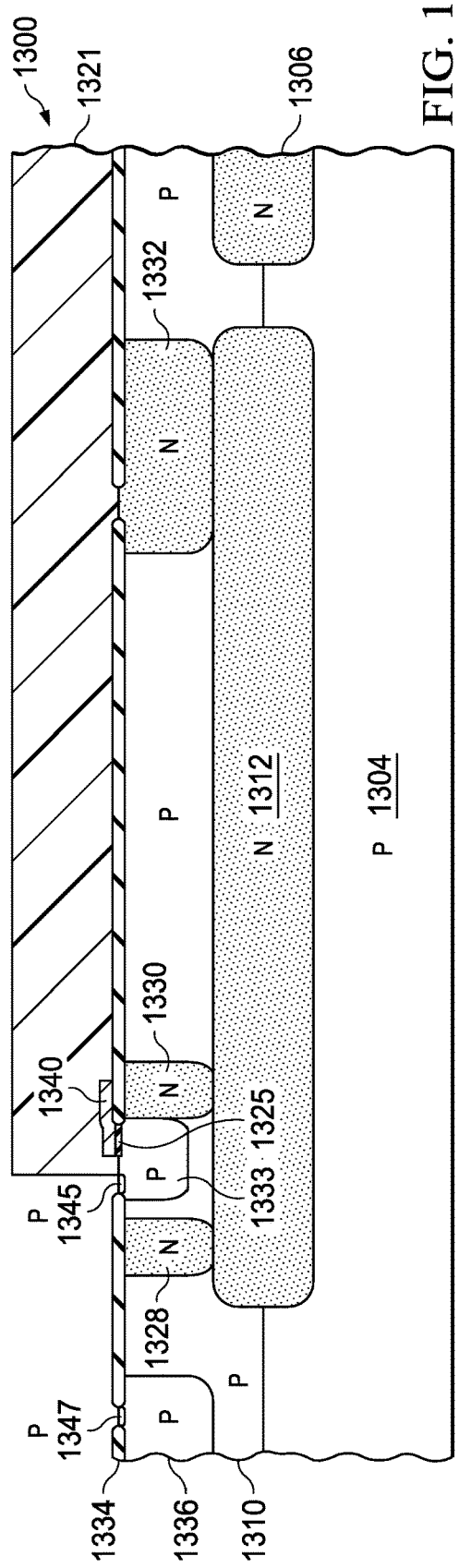
Figure 12M:
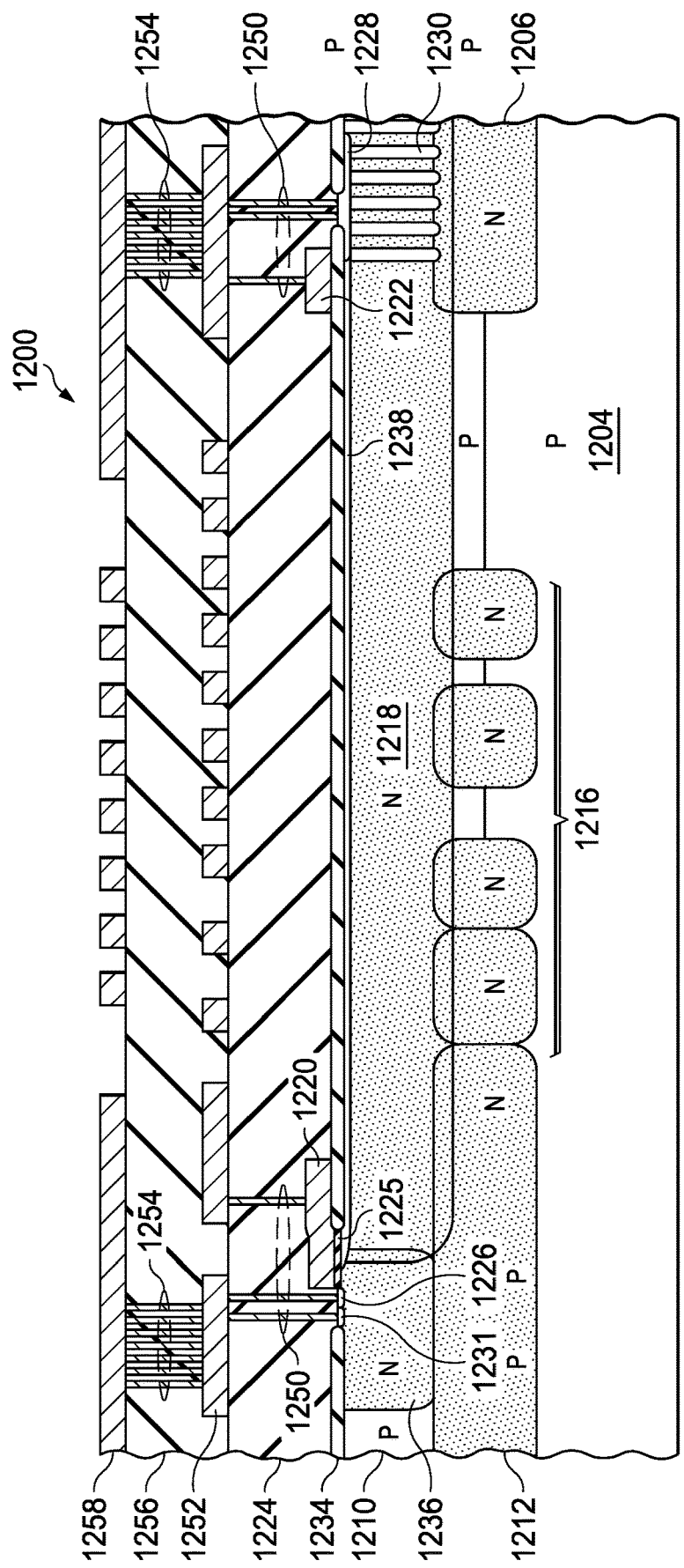
Figure 13M:
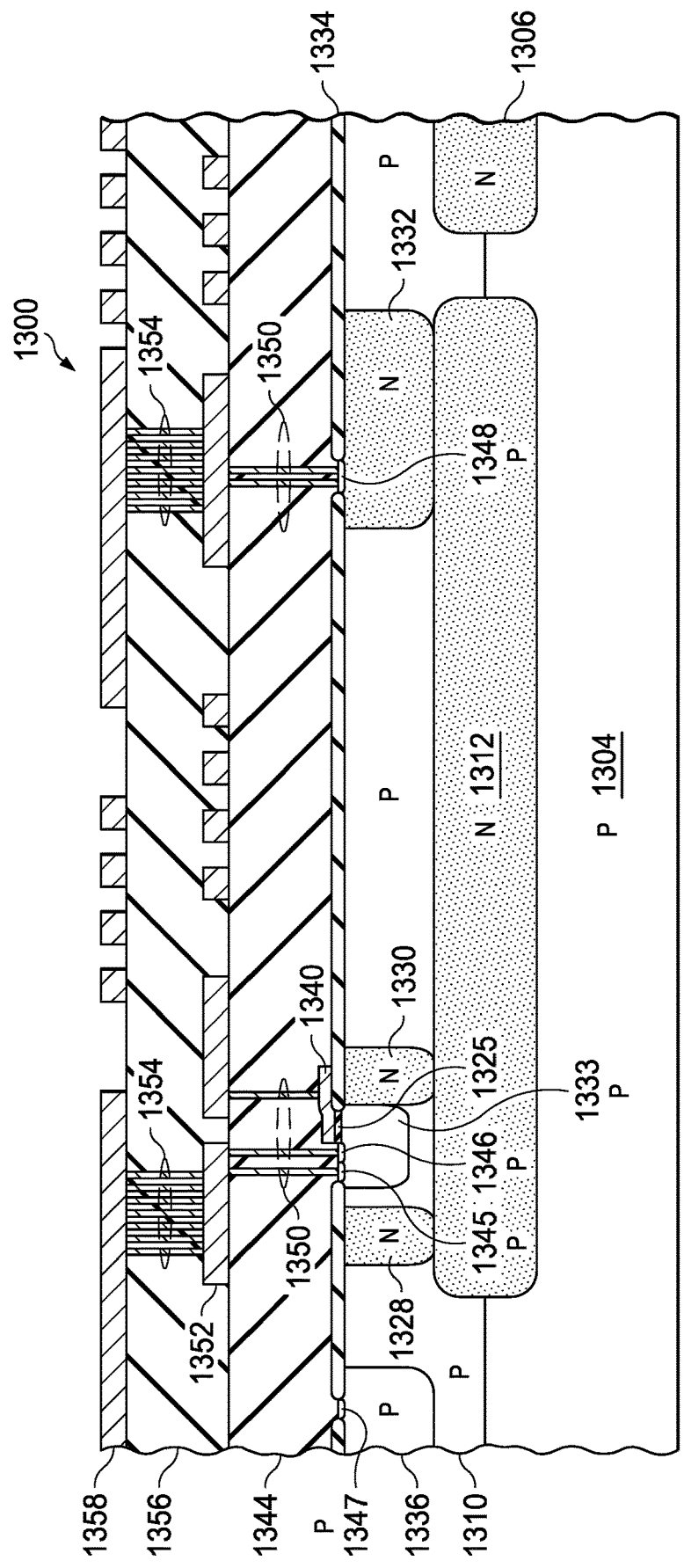

Step 1144 forms source and drain contacts for DEPMOS transistor 1200. Photolithography forms a mask 1221 as shown in FIG. 12K. An ion implantation of boron ions at an energy of 20 keV at a density of $2.0 \times 10^{16}$ atoms/cm$^2$ forms source 1226 and drain contact 1228. Step 1146 forms an isolation well contact and body region contact for LDMOS transistor 1300. Photolithography forms mask 1321 as shown in FIG. 13K. An ion implantation of boron ions at an energy of 20 keV at a density of $2.0 \times 10^{16}$ atoms/cm$^2$ forms isolation well contact 1347 and body region contact 1345.

Step 1148 forms a body contact for DEPMOS transistor 1200. Photolithography forms mask 1223 as shown in FIG. 12L. An ion implantation of phosphorus ions at an energy of 20 keV at a density of $2.0 \times 10^{16}$ atoms/cm$^2$ forms body region contact 1231. Step 1150 forms a source and drain contact for LDMOS transistor 1300. Photolithography forms mask 1323 as shown in FIG. 13L. An ion implantation of phosphorus ions at an energy of 20 keV at a density of $2.0 \times 10^{16}$ atoms/cm$^2$ forms source 1346 and drain contact 1348.

Step 1152 forms vias, interlevel dielectric and metal layers for DEPMOS transistor 1200. First interlevel dielectric layer 1224 is formed using spun-on-glass or plasma-deposited oxide. Vias 1250 are formed in first interlevel dielectric layer 1224. A photolithographic mask (not shown) is used to etch first interlevel dielectric layer 1224. The resulting openings are filled with a conductive material, such as titanium-tungsten. Vias 1250 contact well contact 1231, source 1226, gate 1220, field plate 1222 and drain contact 1228. Specific interconnections are examples. Other examples use other connections to DEPMOS transistor 1200. First metal layer 1252 is deposited on first interlevel dielectric layer 1224 and patterned using photolithography and etching. In this example, first metal layer 1252 is aluminum. In other examples, first metal layer 1252 is other conductive materials, such as copper, titanium, tungsten, other conductors, and alloys thereof. Additional portions of first level metal layer are shown to indicate that first metal layer 1252 is used for interconnections in other components in an integrated circuit containing DEPMOS transistor 1200. Second interlevel dielectric layer 1256 is formed using spun-on-glass or plasma-deposited oxide on first interlevel dielectric layer 1224 and first metal layer 1252. Vias 1254 are formed in second interlevel dielectric layer 1256. A photolithographic mask (not shown) is used to etch second interlevel dielectric layer 1256. The resulting openings are filled with a conductive material, such as titanium-tungsten. Second level metal layer 1258 is deposited on second interlevel dielectric layer 1256 and patterned using photolithography and etching. In this example, second level metal layer 1258 is aluminum. In other examples, second metal level layer 1258 is other conductive materials, such as copper, titanium, tungsten, other conductors, and alloys thereof. Additional portions of second level metal layer 1258 are shown to indicate that second level metal layer 1258 is used for interconnections in other components in an integrated circuit containing DEPMOS transistor 1200. Vias 1254 connect leads in first metal layer 1252 to leads in second level metal layer 1258. In this example, multiple vias 1254 are used to provide high conductivity and high current carrying capacity.

Step 1154 forms vias, interlevel dielectric and metal layers for LDMOS transistor 1300. First interlevel dielectric layer 1344 is formed using spun-on-glass or plasma-deposited oxide. Vias 1350 are formed in first interlevel dielectric layer 1344. A photolithographic mask (not shown) is used to etch first interlevel dielectric layer 1344. The resulting openings are filled with a conductive material, such as titanium-tungsten. Vias 1350 contact body region contact 1345, source 1346, gate 1340, and drain contact 1348. Specific interconnections are examples. In other examples use other connections to LDMOS transistor 1300. First metal layer 1352 is deposited on first interlevel dielectric layer 1344 and patterned using photolithography and etching. In this example, first metal layer 1352 is aluminum. In other examples, first metal layer 1352 is other conductive materials such as copper, titanium, tungsten, other conductors, and alloys thereof. Additional portions of first level metal layer are shown to indicate that first metal layer 1352 is used for interconnections in other components in an integrated circuit containing LDMOS transistor 1300. Second interlevel dielectric layer 1356 is formed using spun-on-glass or plasma-deposited oxide on first interlevel dielectric layer 1344 and first metal layer 1352. Vias 1354 are formed in second interlevel dielectric layer 1356. A photolithographic mask (not shown) is used to etch second interlevel dielectric layer 1356. The resulting openings are filled with a conductive material, such as titanium-tungsten. Second metal layer 1358 is deposited on second interlevel dielectric layer 1356 and patterned using photolithography and etching. In this example, second metal layer 1358 is aluminum. In other examples, second metal layer 12358 is other conductive materials, such as copper, titanium, tungsten, other conductors, and alloys thereof. Additional portions of second metal layer 1358 are shown to indicate that second metal layer 1358 is used for interconnections in other components in an integrated circuit containing LDMOS transistor 1300. Vias 1354 connect leads in first metal layer 1352 to leads in second metal layer 1358. In this example, multiple vias 1354 are used to provide high conductivity and high current carrying capacity.

Modifications are possible in the described examples, and other examples are possible, within the scope of the claims.

What is claimed is:

1. An integrated circuit comprising:
a semiconductor substrate having a first conductivity type and a top surface;
a transistor including:
a buried layer having a second conductivity type within the semiconductor substrate, the buried layer defining a drift region between the buried layer and the top surface;
a body region in the semiconductor substrate extending from the buried layer to the top surface of the semiconductor substrate and having the second conductivity type;
a source having the first conductivity type formed in the body region;
a drain having the first conductivity type and extending from the buried layer to the top surface of the semiconductor substrate;
a drift well having the second conductivity type, the drift well extending from the buried layer toward the top surface and extending from the body region to the drain;
a drift surface layer having the first conductivity type and located between the drift well and the top surface; and
a gate proximate to the top surface of the semiconductor substrate at the body region;
wherein the drift surface layer extends under the gate toward the source further than the drift well extends under the gate toward the source.

2. The integrated circuit of claim 1, wherein the buried layer is a first buried layer, and further comprising an adjacent device having a second buried layer spaced apart from the first buried layer, wherein the drift well extends beyond the drift surface layer toward the second buried layer.

3. The integrated circuit of claim 1, wherein the transistor is a high-side switch of a high-voltage drive circuit.

4. The integrated circuit of claim 1, wherein the buried layer has a graded dopant concentration that increases toward the source and decreases toward the drain.

5. The integrated circuit of claim 2, wherein the drift well extends beyond the drift surface layer toward the second buried layer by at least 1 μm.

6. The integrated circuit of claim 1, wherein the semiconductor substrate is crystalline silicon.

7. The integrated circuit of claim 1, wherein the first conductivity type is p-type, and the second conductivity type is n-type.

8. A transistor comprising:
a buried layer having a second conductivity type in a semiconductor substrate having a first conductivity type, the buried layer spaced apart from a top surface of the semiconductor substrate and defining a drift region between the buried layer and the top surface;
a body region having the second conductivity type located in the semiconductor substrate and extending from the top surface toward the buried layer;
a source having the first conductivity type formed in the body region;
a drift well extending from the buried layer to the top surface of the semiconductor substrate and touching the body region;
a drain having the first conductivity type and extending from the top surface of the semiconductor substrate into the drift well;
a drift surface layer having the first conductivity type between the top surface and the drift well; and
a gate over the body region and between the source and the drift well;
wherein the drift surface layer extends under the gate toward the source further than the drift well extends under the gate toward the source.

9. The transistor of claim 8 wherein the drift well extends beyond the drift surface layer along a periphery of the drift well.

10. The transistor of claim 8, wherein the buried layer is a first buried layer spaced apart from a second buried layer of an adjacent device by a transition region, and the drift well extends toward the second buried layer in the transition region further than the drift surface layer extends toward the second buried layer in the transition region.

11. The transistor of claim 8, wherein the drift surface layer has a first dopant concentration at least four orders of magnitude greater than a second dopant concentration of the drift well.

12. The transistor of claim 8, wherein the first conductivity type is p-type, and the conductivity type is n-type.

13. The transistor of claim 8, wherein the buried layer has a graded dopant concentration that increases toward the source and decreases toward the drain.

14. A method comprising:
forming a buried region in a substrate, the substrate having a first conductivity type and the buried region having a second conductivity type, the buried region defining a drift region between the buried region and a surface of the substrate;
forming a body region having the second conductivity type extending from the surface of the substrate toward the buried region;
forming a drain having the first conductivity type and extending from the surface of the substrate toward the buried region, wherein at least a portion of the drift region is between the body region and the drain;
forming a drift well having the second conductivity type in the drift region;
forming a drift surface layer having the first conductivity type between the drift well and the surface of the substrate;
forming a source having the first conductivity type in the body region; and
forming a gate proximate to the body region between the source and the drift region;
wherein the drift surface layer extends under the gate toward the source further than the drift well extends under the gate toward the source.

15. The method of claim 14, further comprising forming a gate oxide between the gate and the body region.

16. The method of claim 14, wherein the first conductivity type is p-type, and the second conductivity type is n-type.

17. The method of claim 14, wherein the buried region is a first buried region and further comprising forming diode including a second buried region spaced apart from the first buried region, wherein the drift well extends past the drift surface layer toward the second buried region.

18. The method of claim 14, wherein the substrate includes an underlying substrate and an epitaxial layer.

19. The method of claim 14, further comprising forming a field oxide on the surface of the substrate between the body region and the drain.

20. A transistor comprising:
a buried layer having a second conductivity type in a semiconductor substrate having a first conductivity type, the buried layer spaced apart from a top surface of the semiconductor substrate and defining a drift region between the buried layer and the top surface;

a body region having the second conductivity type located in the semiconductor substrate and extending from the top surface toward the buried layer;

a source having the first conductivity type formed in the body region;

a drift well extending from the buried layer to the top surface of the semiconductor substrate and touching the body region;

a drain having the first conductivity type and extending from the top surface of the semiconductor substrate into the drift well;

a drift surface layer having the first conductivity type between the top surface and the drift well; and a gate over the body region and between the source and the drift well;

wherein the drift surface layer has a first dopant concentration at least four orders of magnitude greater than a second dopant concentration of the drift well.

\* \* \* \* \*